(12) United States Patent
Pano et al.

(10) Patent No.: US 11,329,362 B2
(45) Date of Patent: May 10, 2022

(54) TSV-BASED ON-CHIP ANTENNAS, MEASUREMENT, AND EVALUATION

(71) Applicant: Drexel University, Philadelphia, PA (US)

(72) Inventors: Vasil Pano, Philadelphia, PA (US); Ibrahim Tekin, Tuzla (TR); Baris Taskin, Philadelphia, PA (US); Kapil R. Dandekar, Philadelphia, PA (US); Yuqiao Liu, Narberth, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 16/719,536

(22) Filed: Dec. 18, 2019

(65) Prior Publication Data

US 2020/0212538 A1   Jul. 2, 2020

Related U.S. Application Data

(60) Provisional application No. 62/781,090, filed on Dec. 18, 2018.

(51) Int. Cl.
*H01Q 1/22* (2006.01)
*H01Q 9/30* (2006.01)
*H01Q 1/48* (2006.01)
*H01L 23/66* (2006.01)

(52) U.S. Cl.
CPC .......... *H01Q 1/2283* (2013.01); *H01L 23/66* (2013.01); *H01Q 1/48* (2013.01); *H01Q 9/30* (2013.01); *H01L 2223/6616* (2013.01); *H01L 2223/6627* (2013.01); *H01L 2223/6677* (2013.01)

(58) Field of Classification Search
CPC .......... H01Q 1/2283; H01Q 9/30; H01Q 1/48; H01Q 9/36; H01L 23/66; H01L 2223/6627; H01L 2223/6677; H01L 2223/6616

See application file for complete search history.

(56) References Cited

U.S. PATENT DOCUMENTS 10,756,416 B2 *   8/2020   Hwangbo .............. H01Q 1/32
2017/0186710 A1 *   6/2017   Yoon .......................... H01P 7/08

OTHER PUBLICATIONS

Liu, et al., "Innovative Propagation Mechanism for Inter-chip and Intra-chip Communication", IEEXplore, https://ieeexplore.IEEE.org/document/7120367, Jun. 11, 2015, 6 pages.

(Continued)

*Primary Examiner* — Seung H Lee
(74) *Attorney, Agent, or Firm* — Schott, P.C.

(57) ABSTRACT

On-chip wireless links offer improved network performance due to long distance communication, additional bandwidth, and broadcasting capabilities of antennas. A Through-Silicon Via (TSV)-based antenna design called TSV_A establishes multi-band wireless communication through the silicon substrate medium with only a 3 dB loss over a 30 mm on-chip distance. Simulation results show an improvement in network latency up to ~13% (average improvement of ~7%), energy-delay improvements of ~34% on average, and an improvement in throughput up to ~34% (average improvement).

12 Claims, 20 Drawing Sheets

(56) References Cited

OTHER PUBLICATIONS

Pano, et al., "Wireless NoCs using Directional and Substrate Propagation Antennas", IEE Xplore, https://ieeexplore.ieee.org/document/7987517, Jul. 24, 2017, 6 pages.

Pano, et al., "Wireless Network-on-Chip Analysis of Propagation Technique for On-chip Communication", IEE Xplore, https://ieeexplore.ieee.org/document/7753313, Nov. 24, 2016, 4 pages.

* cited by examiner

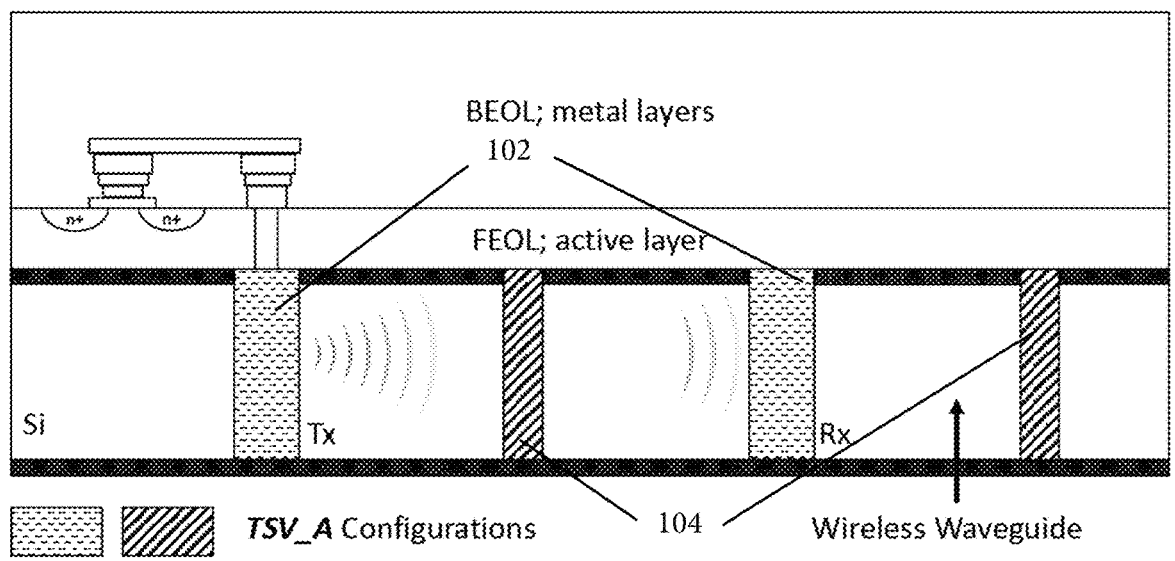
FIG. 1.1

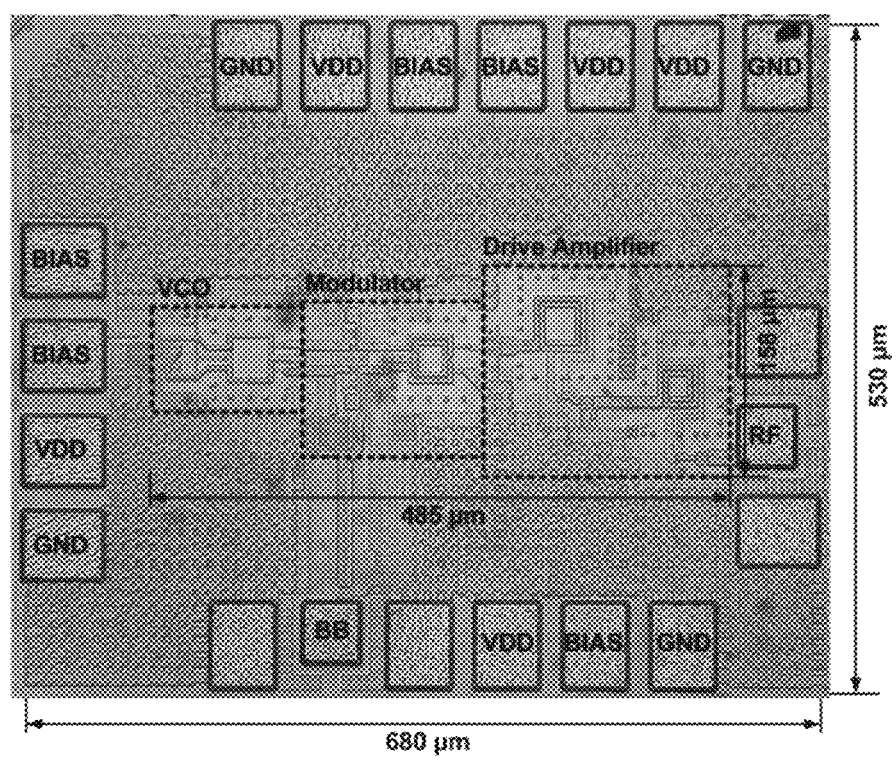
FIG. 1.2

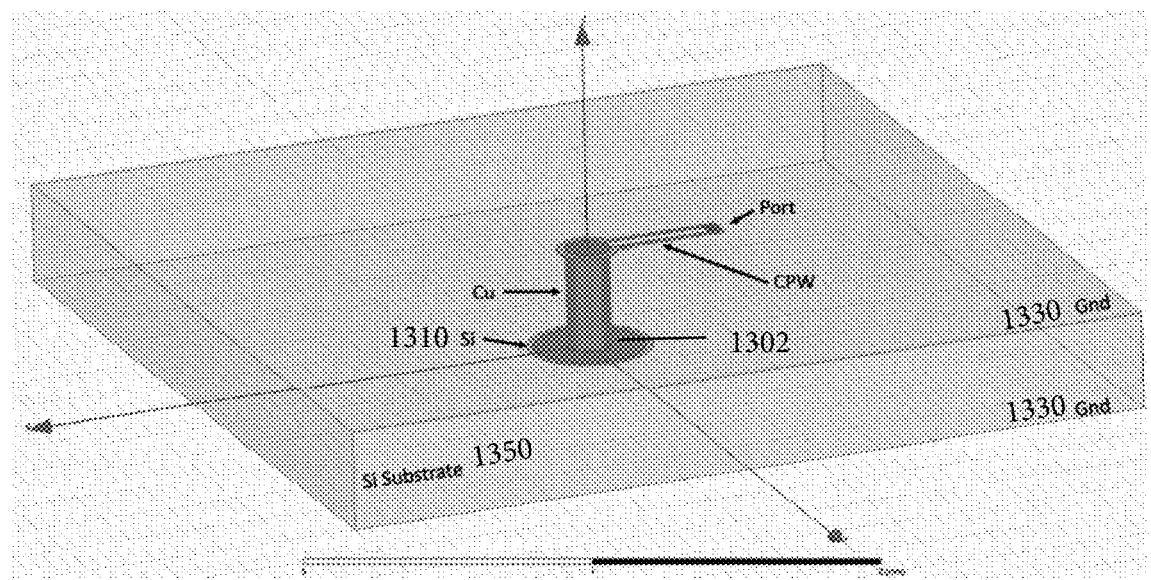
FIG. 1.3(a)
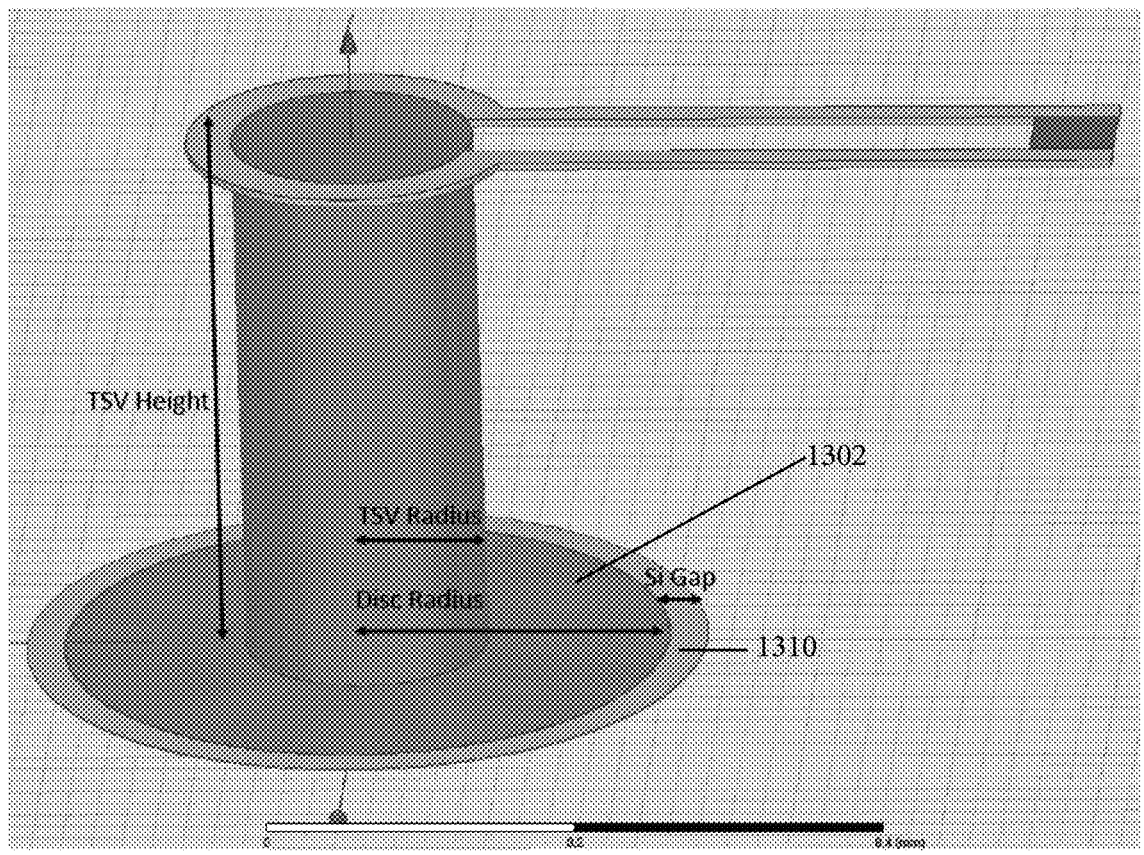
FIG. 1.3(b)

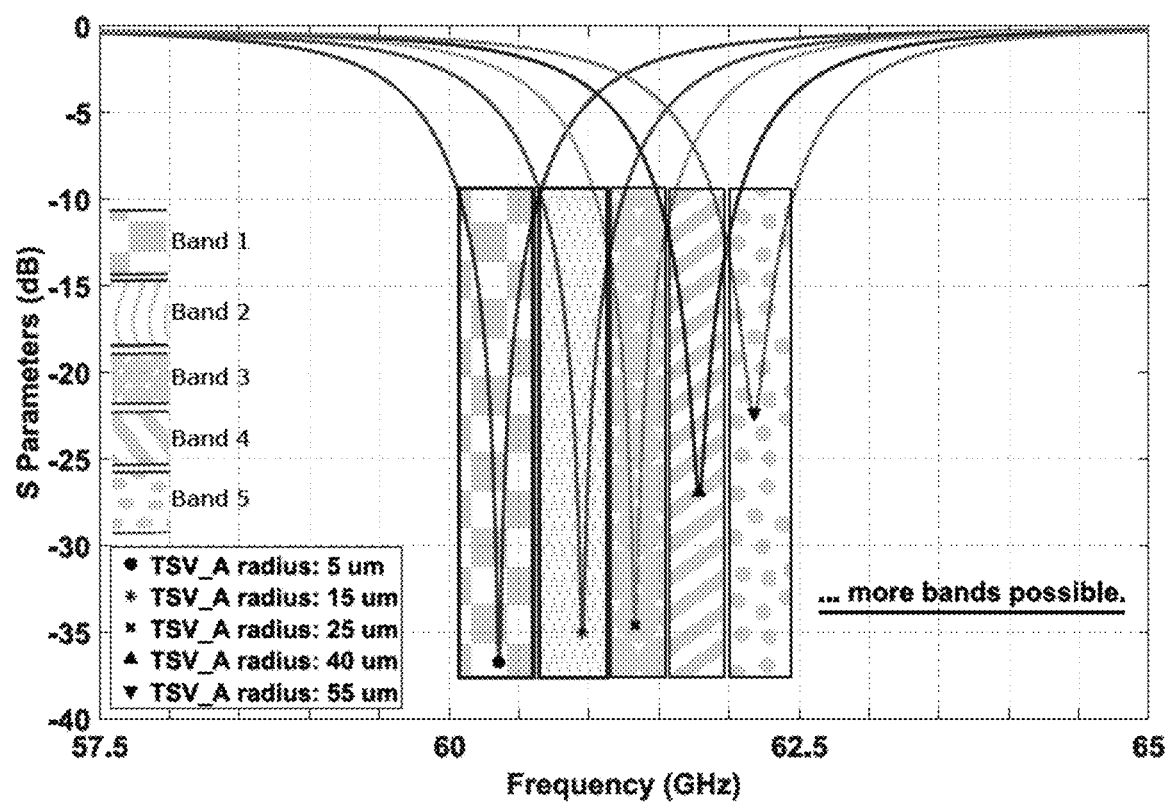
FIG. 1.4

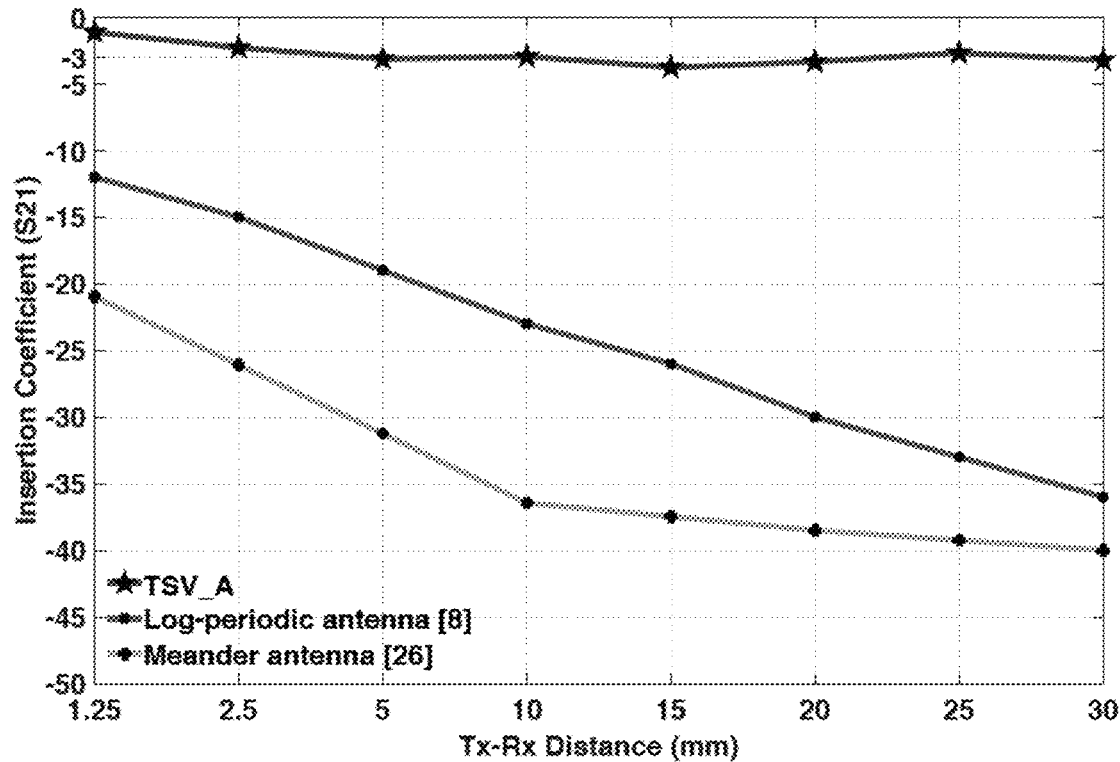
FIG. 1.5
TABLE I. Wireless NoC Parameters
| Parameter | Design |
|---|---|
| Mesh size | 12x12 |
| Total # of PEs | 144 PEs |
| # of Virtual Channels | 4 VCs |
| # of Router I/O Buffers | 4 (flits) |
| # of TSV_As | 64 |
| # of TSV_A Buffers | 10 (flits) |
| Flit Size | 32 bits |
| Packet Size | 10 flits |
FIG. 1.11

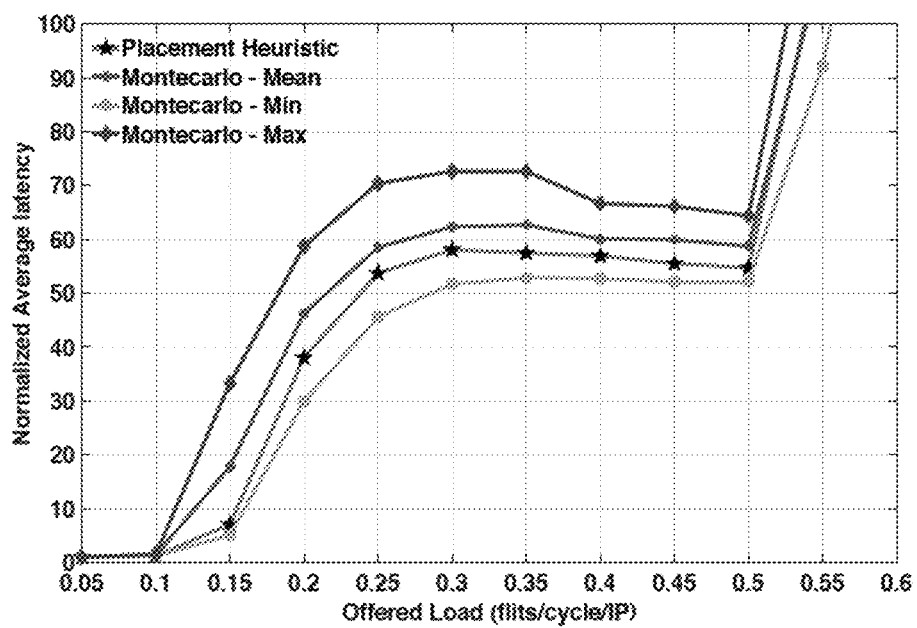
FIG. 1.6

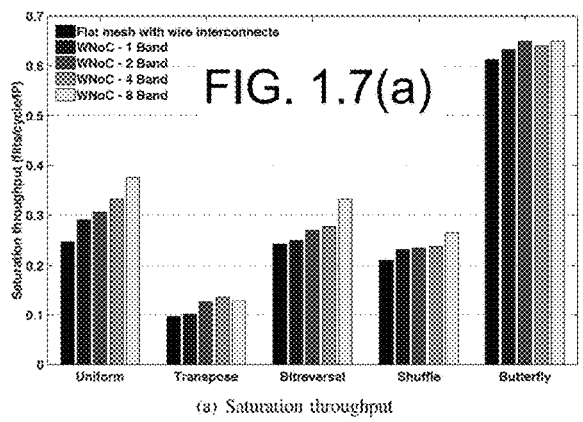
FIG. 1.7(a) Saturation throughput
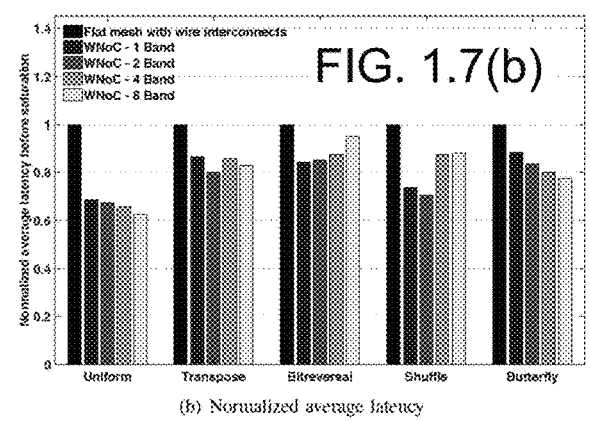
FIG. 1.7(b) Normalized average latency
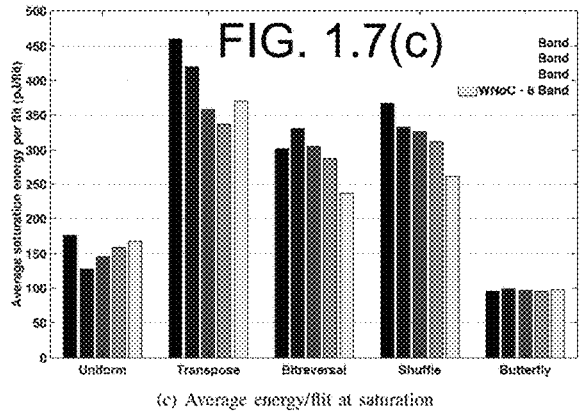
FIG. 1.7(c) Average energy/flit at saturation
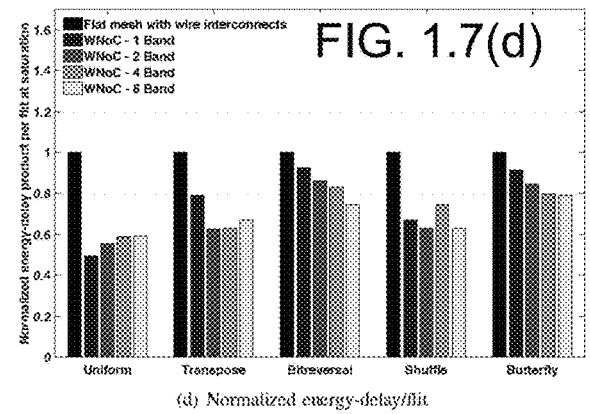
FIG. 1.7(d) Normalized energy-delay/flit

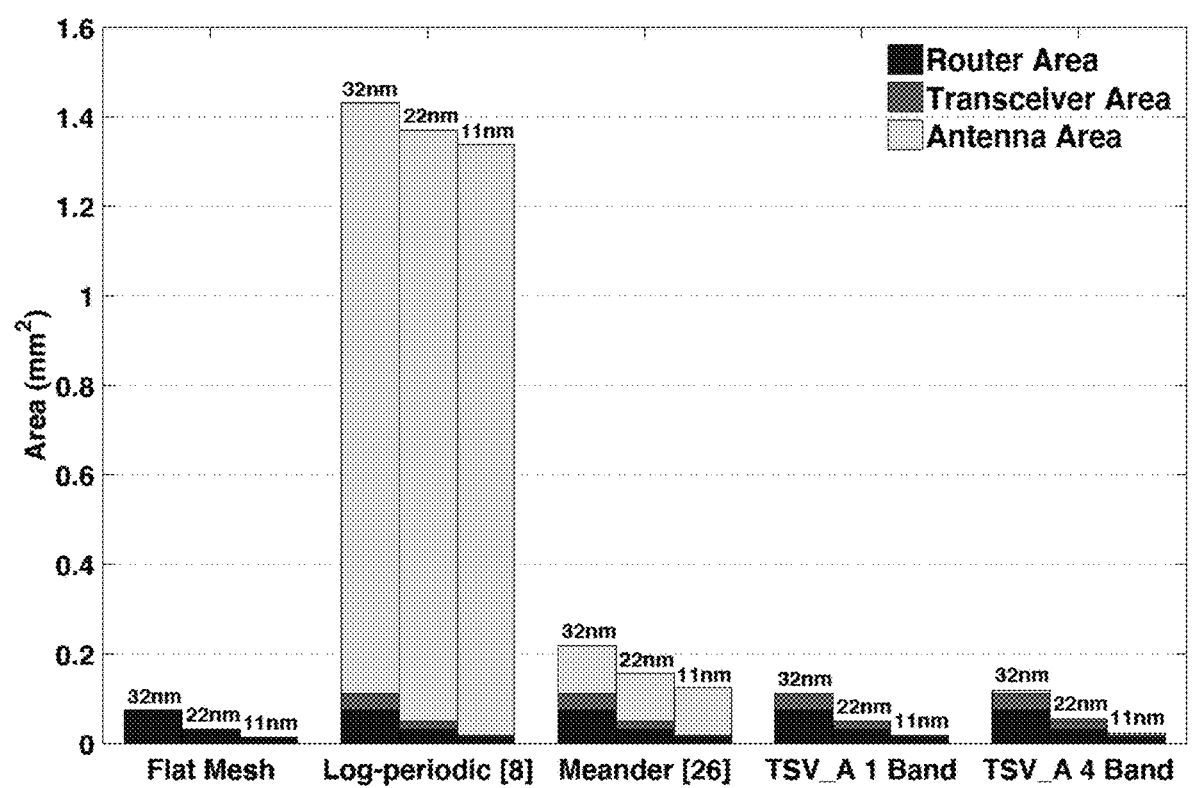
FIG. 1.8

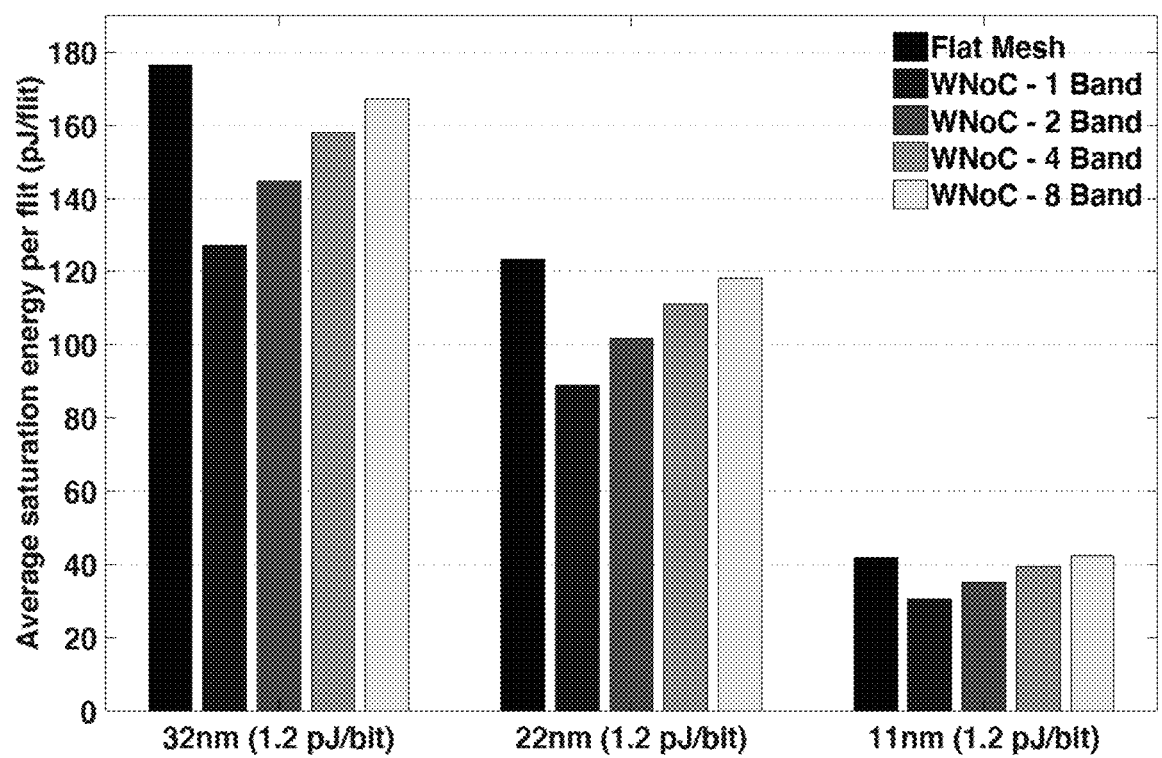
FIG. 1.9

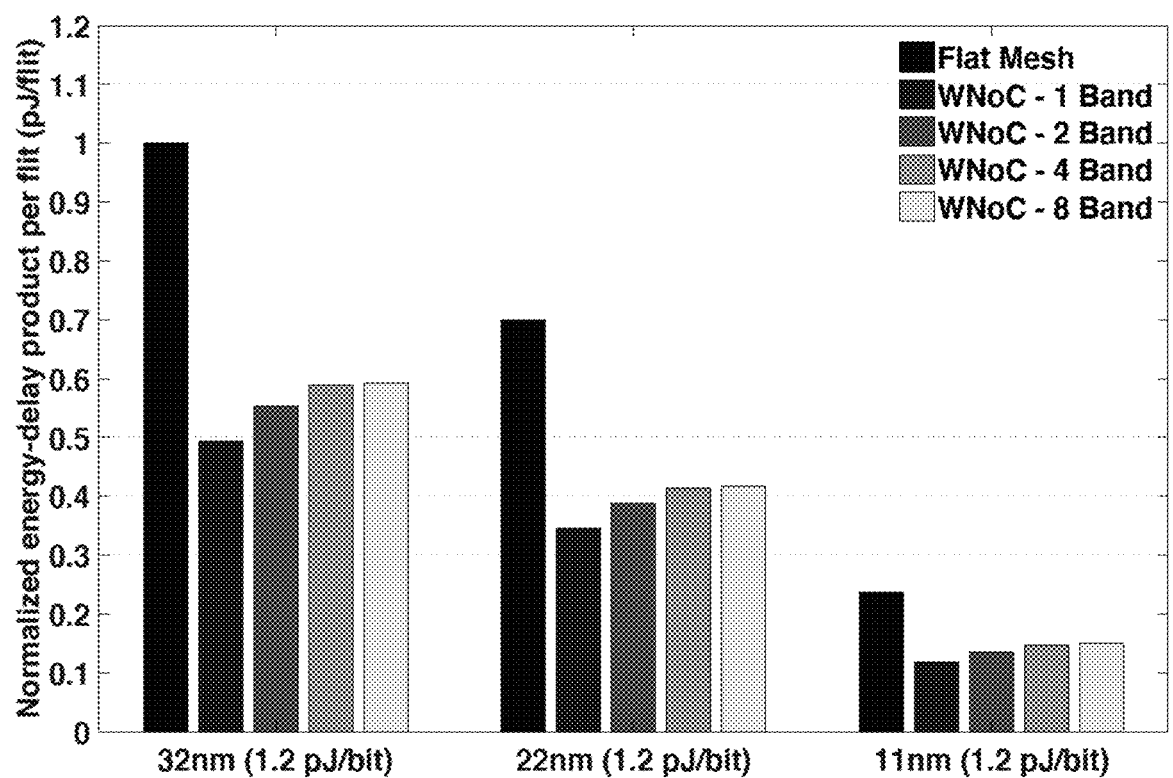
FIG. 1.10

Algorithm 1 Multi-Band Antenna Placement for WNoC.

Input:
    Number of wireless bands $W$, Number of TSV_As per wireless band, $X, Y$: each router pair on the WNoC, $t$: current temperature for SA, $t_{final}$: final temperature for SA, $i_{total}$: number of iterations at each temperature for SA.

Output:
    A two dimensional array representing TSV_As on a WNoC with values representing the TSV_A position and the wireless band.

{Calculate aggregate $totalDist$ w/o TSV_As}
1: for each $Band \in W$ do
    {Randomly place all TSV_A of $Band$}
    {Start simulated annealing...}
2:   while $t > t_{final}$ do
3:     for $i = 1$ to $i_{total}$ do
4:       Switch random TSV_A location with neighbor
5:       $update\ totalDist = \Sigma\ calcDist(X, Y)$
6:       if $totalDist_{new} < totalDist_{old}$ then
7:         $permPlacement \leftarrow$ TSV_A
8:       else
9:         Generate random number $x$ from 0 to 1
10:         if $x < \exp\left(\frac{-\Delta totalDist}{t}\right)$ then
11:           $permPlacement[] \leftarrow$ TSV_A
12:         end if
13:       end if
14:     end for
15:     Decrement $t$
16:   end while
17: end for
18: Return $permPlacement$
    {$calcDist$ calculates the distance of each $X, Y$ pair on the WNoC}
    {$calcDist$ only re-executes if TSV_A is on XY-path}
    {$permPlacement[]$ is the final position of the TSV_As}

FIG. 1.12

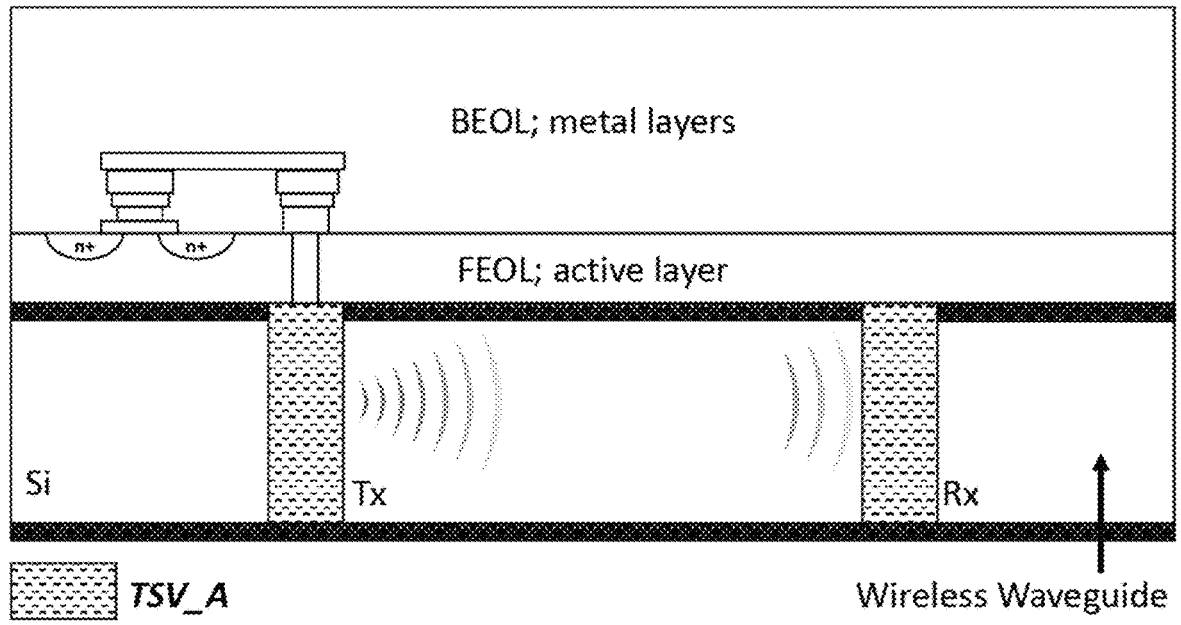
FIG. 2.1
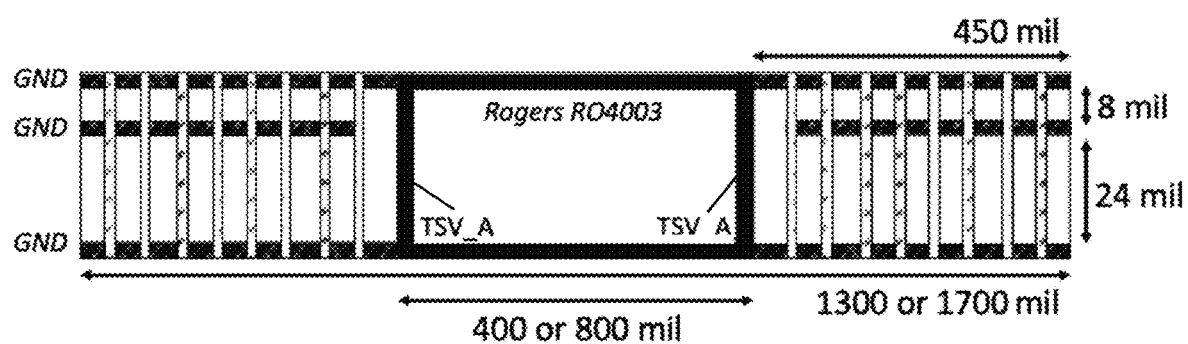
FIG. 2.2

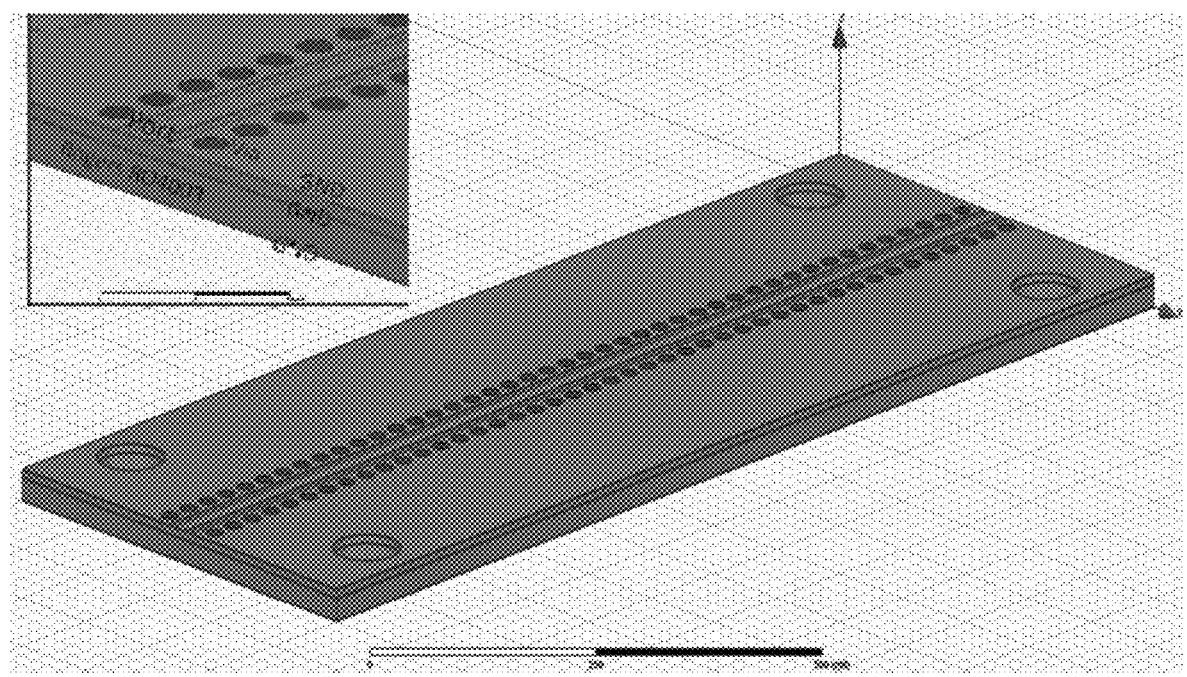
FIG. 2.3

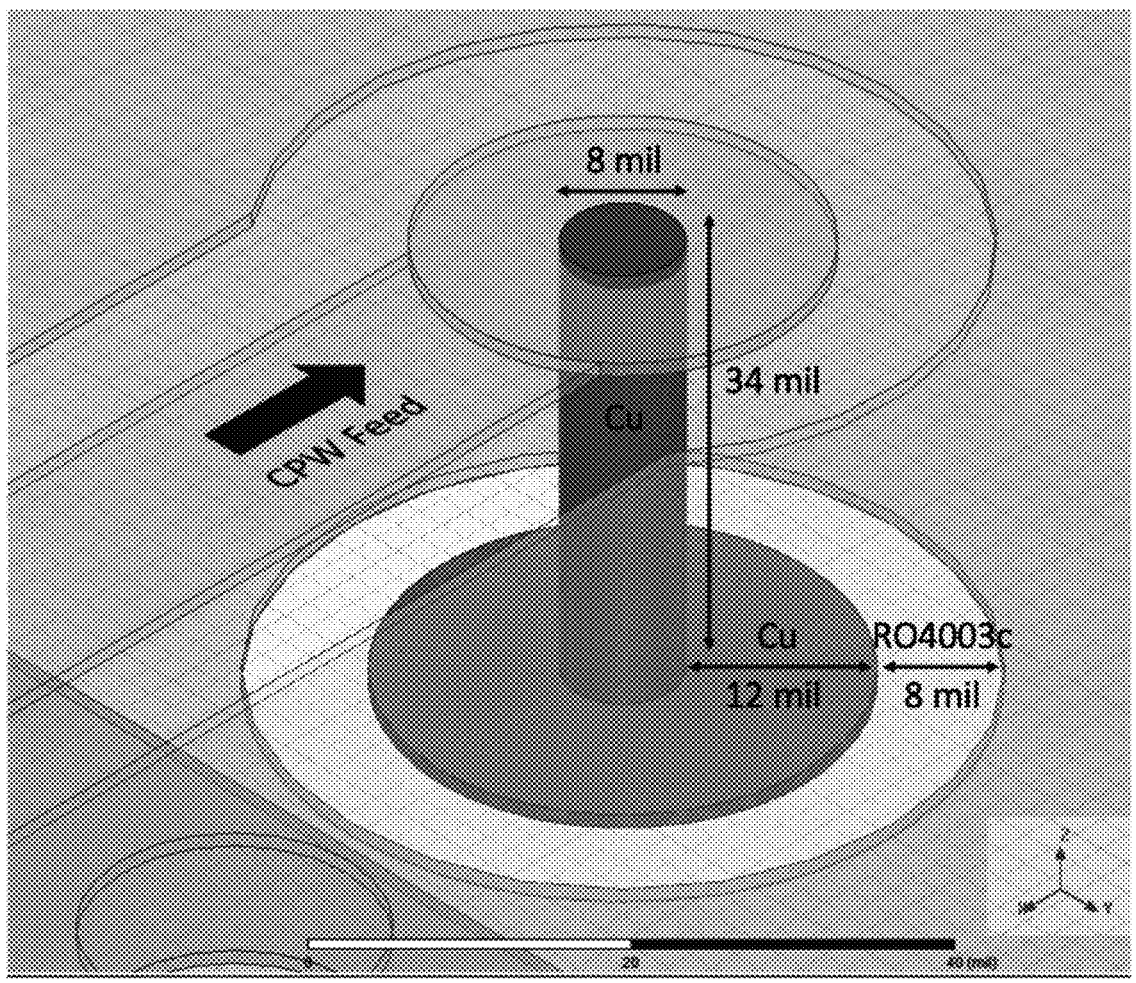
FIG. 2.4

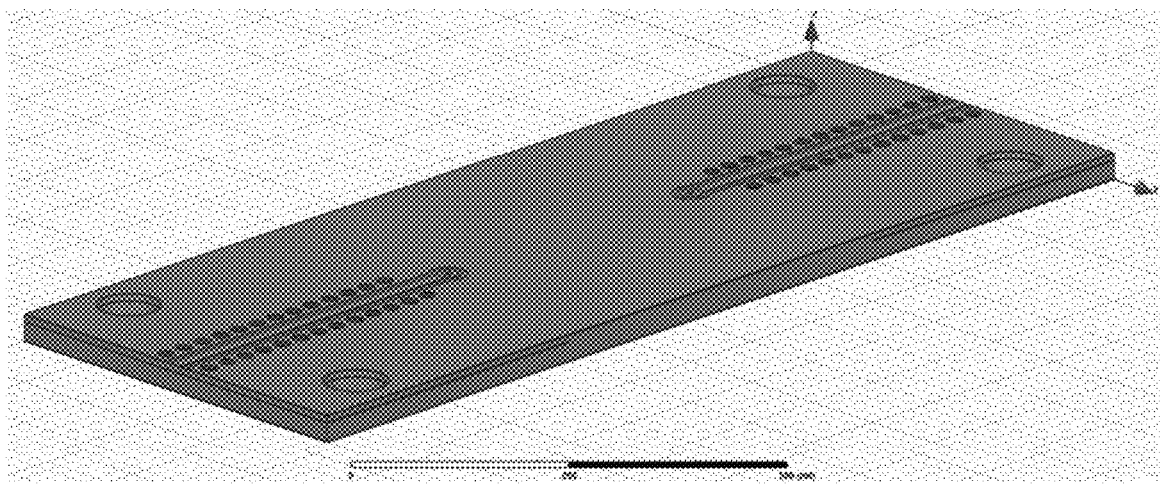
FIG. 2.5

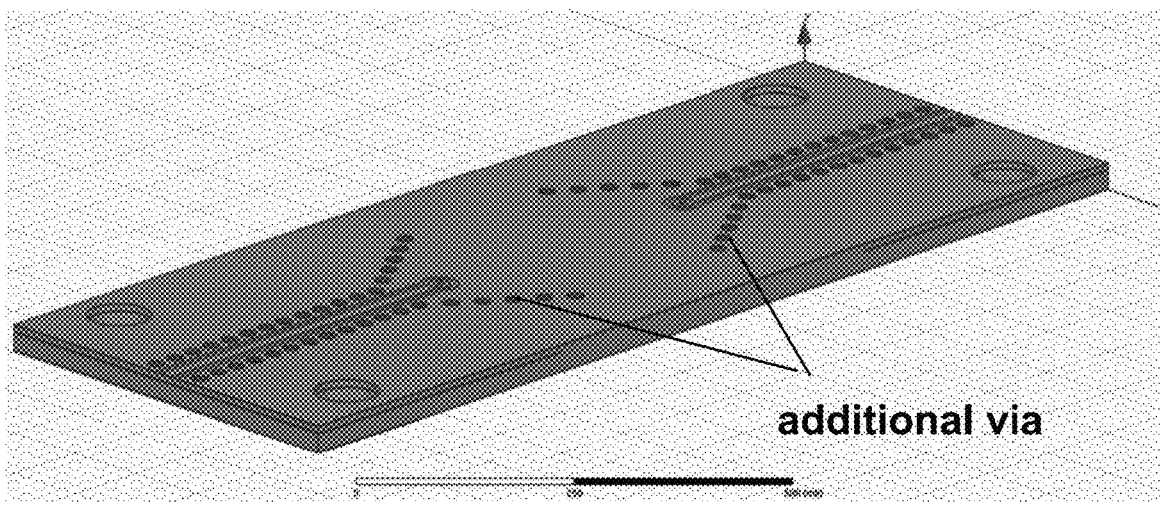
FIG. 2.6
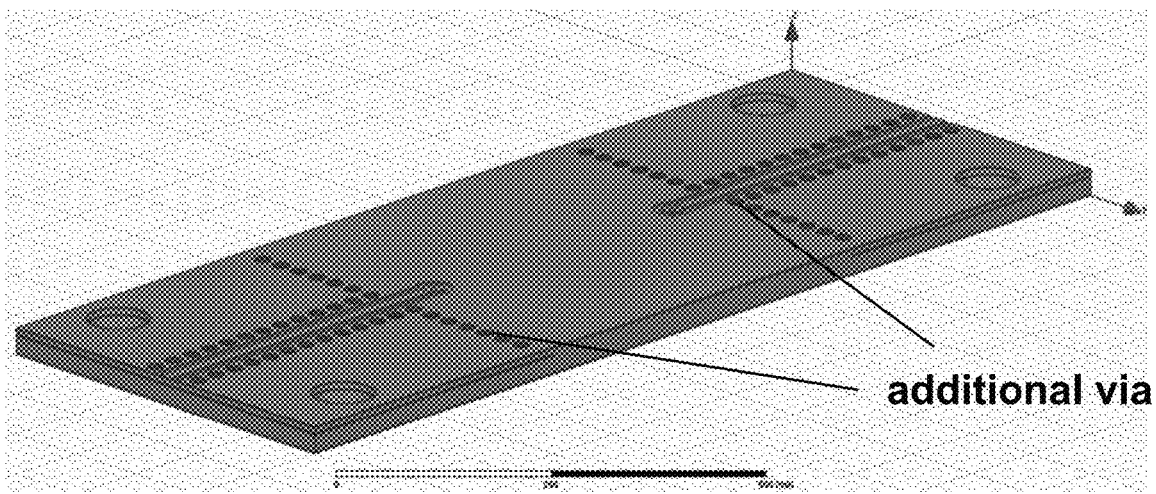
FIG. 2.7

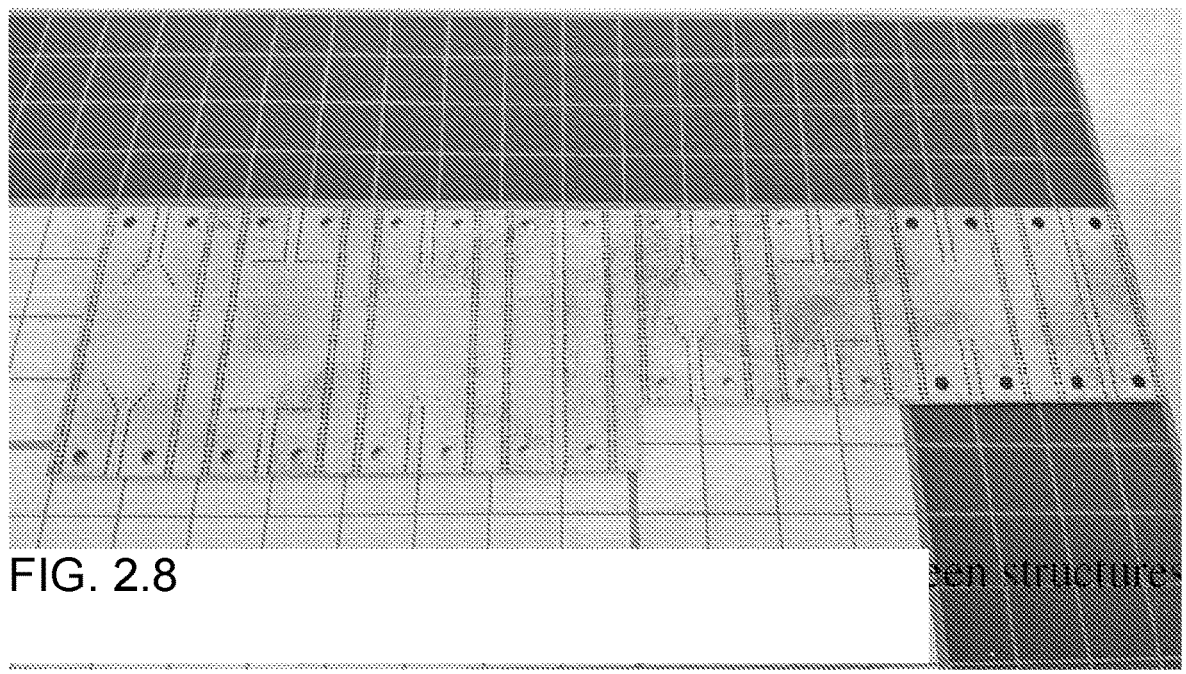
FIG. 2.8
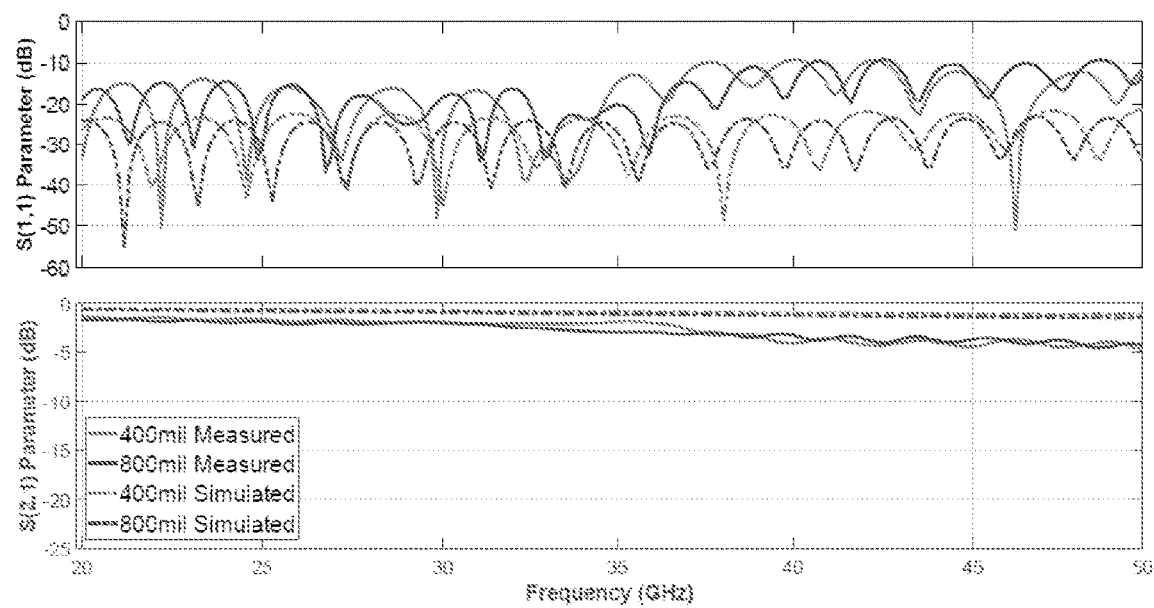
FIG. 2.9

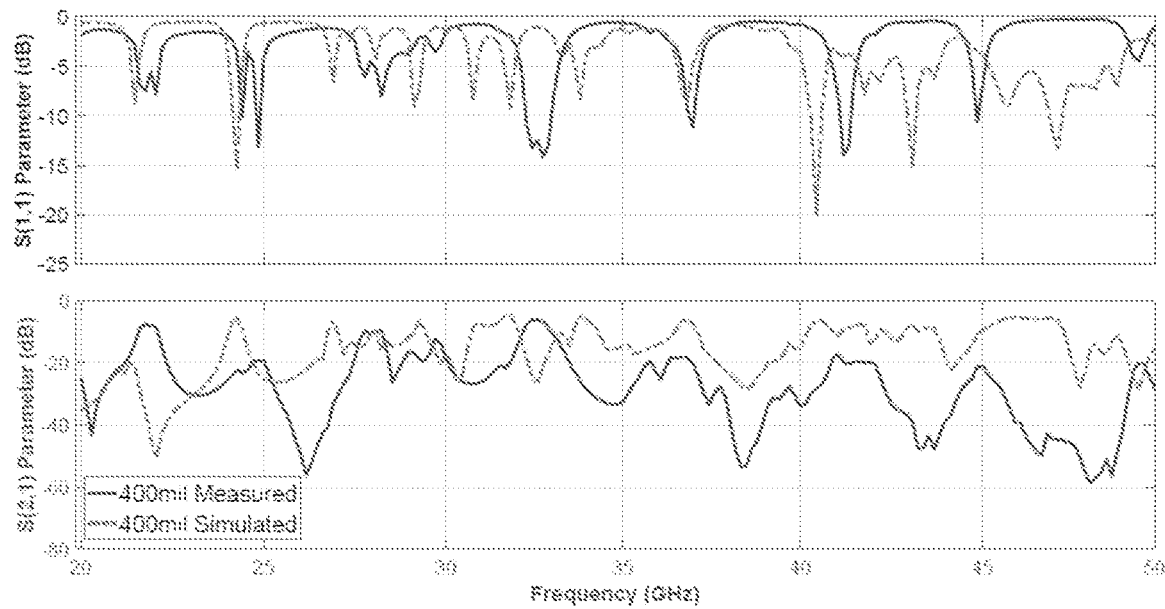
TSV_As at 400mil distance.  FIG. 2.10(a)
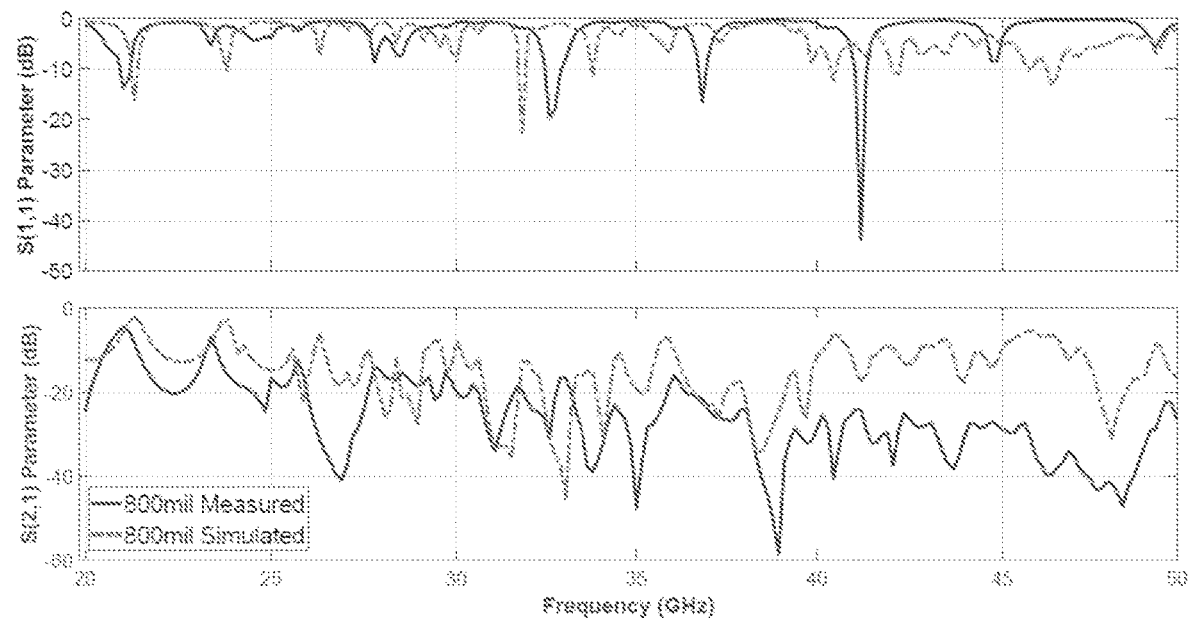
TSV_As at 800mil distance.  FIG. 2.10(b)

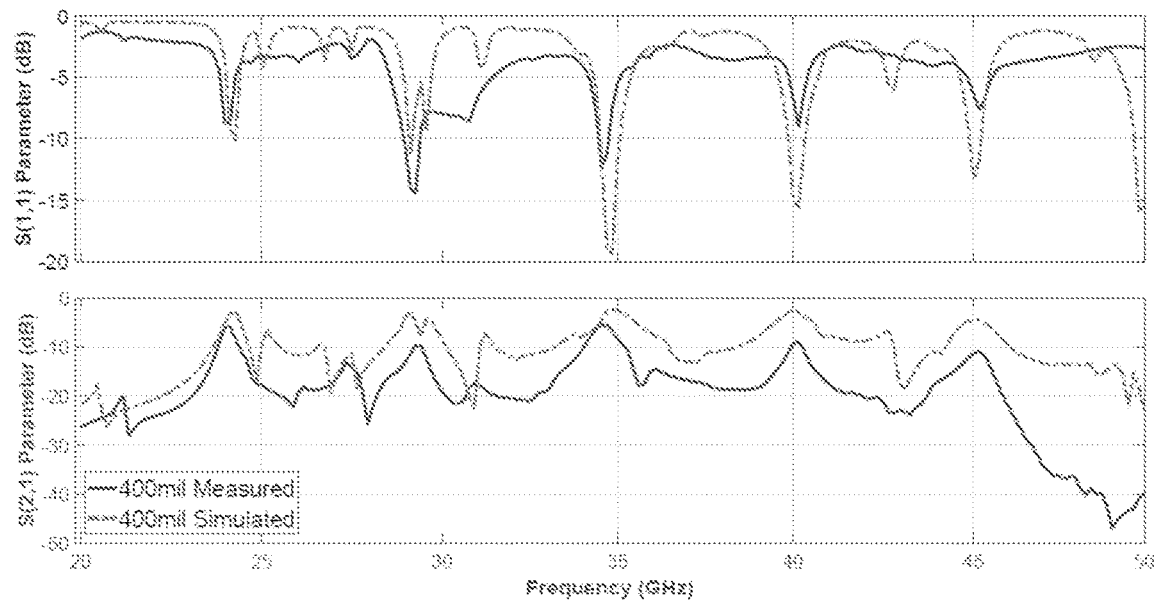
TSV_As at 400mil distance.
FIG. 2.11(a)
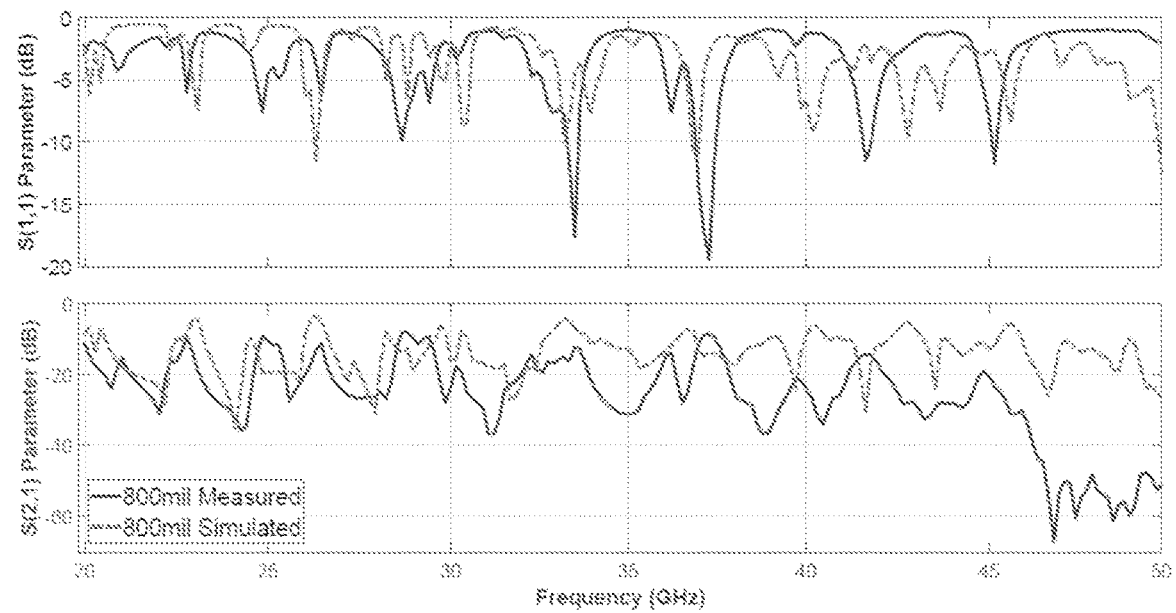
TSV_As at 800mil distance.
FIG. 2.11(b)

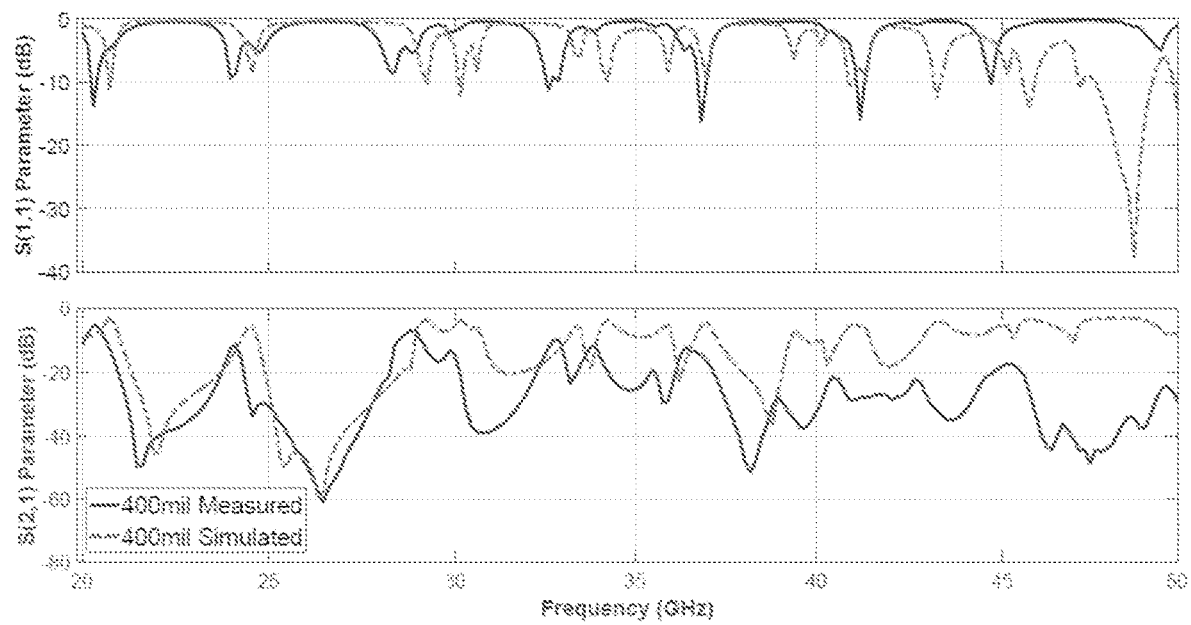
TSV_As at 400mil distance. FIG. 2.12(a)
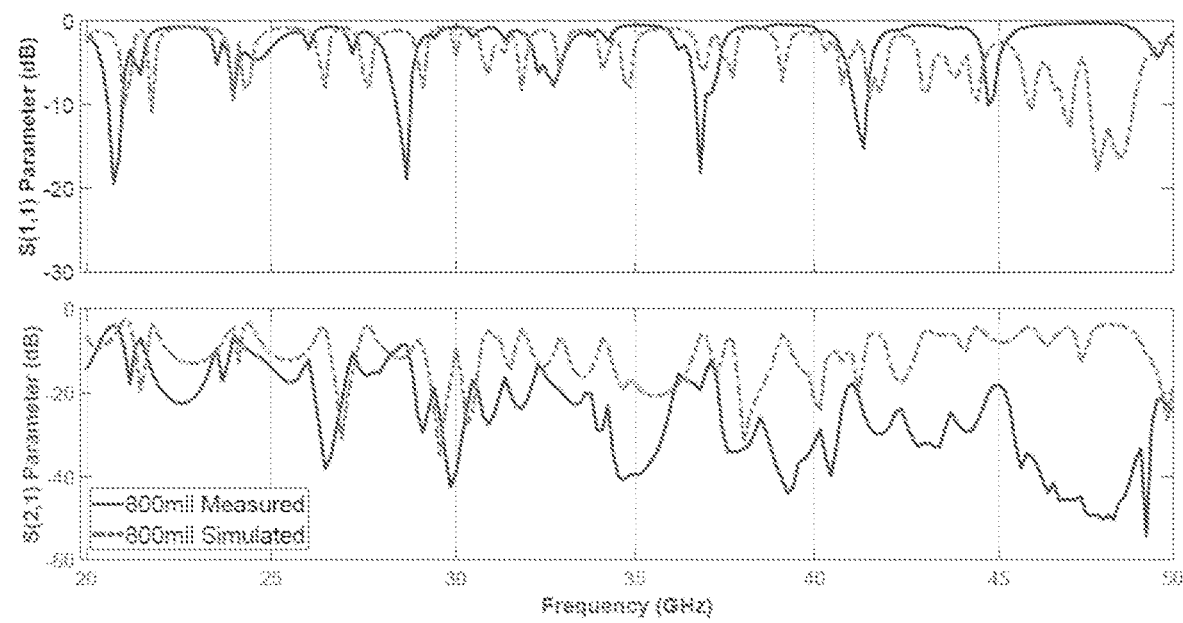
TSV_As at 800mil distance. FIG. 2.12(b)

TSV-BASED ON-CHIP ANTENNAS, MEASUREMENT, AND EVALUATION

STATEMENT REGARDING GOVERNMENT SUPPORT

This invention was made with government support under Contract No. 1305350 awarded by the National Science Foundation. The government has certain rights in the invention.

BACKGROUND

The feasibility of on-chip wireless interconnects demonstrated multiple fabricated (90 nm-130 nm technology) antennas. The antenna designs evaluated the dipole and zig-zag antennas, which included Carbon nanotube (CNT) as the primary material for dipole antennas. The distinct properties of CNT support operational in the THz or optical frequency range and can achieve a bandwidth of 500 GHz. Although this technology is promising, fabrication is challenging.

The addition of wireless interconnects in Network-on-Chip (NoCs) has been studied extensively. The work on wireless NoCs (WNoCs) focuses on the key elements necessary for wireless operation, including topology, routing, flit/packet wireless transmission, and various wireless protocols.

Some have designed efficient WNoC architectures and algorithms based on the zig-zag antenna. Others propose (and fabricated in 65 nm bulk CMOS process shown in FIG. 1.2) an on-off keying (OOK) transmitter and receiver which consume only 1.2 pJ/bit at a data rate of 16 Gb/s operating at 60 GHz. And others propose a wireless NoC (using the zig-zag antenna) with knowledge of the voltage frequency islands (VFI) within the chip in order to optimize intra-VFI, inter-VFI, and core to dynamic V/F controller communication.

Scalable, energy-efficient, and adaptive WNoCs are based on the theoretical feasibility of CNTs with an optimistic 512 GHz bandwidth and operation in the THz band. The focus of such work is on the complications of scalable NoCs and the changes required to optimize overall throughput. Interference is not as much of a concern because each wireless channel operates at a different carrier frequency.

RF-interconnects may use transmission lines (on or off chip) to guide EM waves from the transmitter to the receiver. RF-I multi-band properties (each transmission line can be a separate band) show a clear distinction from the single wireless channel operation. Although capable of total aggregate data rate of 30 Gb/s per RF-I wire, the wireless benefits of broadcast and non-line-of-sight (NLOS) are not possible in RF-I interconnects.

Some WNoCs with multi-band use the directional characteristics of on-chip antennas and use a planar log-periodic antenna with enhanced directional capabilities to form three concurrent wireless links. Each pair of antennas may not have line-of-sight with the rest, therefore interference is avoided. The planar log-periodic antennas occupy a large chip area and is interference-free only if the antenna pairs do not cross. These may use a zig-zag antenna at different angles to form groups of wireless communication within a single chip. Issues may arise and antennas may have to be aligned a specific position and interference is only avoided if there is no line-of-sight between groups.

Some have evaluated the impact of antenna positioning on the different metal layers of the BEOL stack. It has been observed that the carrier frequency of a meander antenna shifts if it is placed in metal layer 5 as opposed to metal layer 10. The feasibility of WNoCs with multi-band by placing multiple meander antennas at different metal layers has been studied. The conclusions indicate that it is possible to create multi-bands without line-of-sight but the transmission loss is too large and no system-level evaluations are performed. The meander and planar log-periodic antennas are evaluated against the proposed TSV_A.

Recently, a Through-Glass Via monopole antenna for 3D IC was proposed. HFSS simulations and PCB fabrication show a carrier frequency between 70 to 90 GHz, with a bandwidth of ~10 GHz. The fabricated TGV antenna was designed at 6 GHz and displays similar characteristics to the simulated version. NoC performance, path loss, or insertion loss are not evaluated for TGVs, therefore system-level performance impacts are unknown.

SUMMARY OF THE EMBODIMENTS

On-chip wireless links offer improved network performance due to long distance communication, additional bandwidth, and broadcasting capabilities of antennas. This work challenges the on-chip antenna design conventions, and pushes toward a Through-Silicon Via (TSV)-based antenna design called TSV_A that establishes wireless communication through the silicon substrate medium.

The novel on-chip antenna (TSV_A) may be implemented with TSVs and based on the disc-loaded monopole antenna-style. The area of this antenna may be 400 micrometers, which offers a 3300× and 265× area reduction compared to the planar log-periodic and meander antennas, respectively. The TSV_A also may have minimal attenuation (or path loss). The main reason that this on-chip novel antenna works so well in long distances is because the wireless communication happens through the silicon substrate medium (which acts as a wireless waveguide for the signal). Other on-chip antennas radiate on the surface of the chip and their attenuation is much worse compared to TSV_A.

BRIEF DESCRIPTION OF THE DRAWINGS

The attached figures may illustrate aspects of the invention.

FIG. 1.1 shows a die cross-section with 4 TSV_As for on-chip wireless communication.

FIG. 1.2 shows an OOK transmitter: 1.2 pJ/bit at a data rate of 16 Gb/s operating at 60 GHz.

FIGS. 1.3(a) and 1.3(b) show the TSV_A HFSS simulation environment and design.

FIG. 1.4 shows a graph of reflection coefficient (S11) versus frequency at a variable TSV radius. Each box represents a separate band.

FIG. 1.5 shows transmission coefficient (S21) versus distance.

FIG. 1.6 shows a Monte Carlo analysis of latency in a WNoC.

FIGS. 1.7(a)-(d) show experimental results for varying synthetic traffic patterns.

FIG. 1.8 is a bar graph showing area estimation for multiple technology nodes.

FIG. 1.9 shows energy estimation for multiple technology nodes for uniform traffic with 1.2 pJ/bit TSV_As.

FIG. 1.10 shows energy-delay product for multiple technology nodes for uniform traffic with 1.2 pJ/bit TSV_As.

FIG. 1.11 shows Table I.

FIG. 1.12 shows the TSV_A placement algorithm.

FIG. 2.1 is an illustration of die cross-section with 2 TSV_As.

FIG. 2.2 is a cross-section of the PCB prototype.

FIG. 2.3 shows a CPW used to feed the signal to the TSV_A.

FIG. 2.4 shows a structure for a TSV_A similar to that shown in FIGS. 1.3(*a*) and 1.3(*b*).

FIG. 2.5 shows two TSV_As facing each other on the PCB structure.

FIG. 2.6 shows a TSV_A with additional via for increased directivity.

FIG. 2.7 shows a TSV_A with additional via for increased isolation.

FIG. 2.8 shows a fabricated PCB.

FIG. 2.9 shows Simulated and measured results of the PCB fabricated CPW.

FIGS. 2.10(*a*) and (*b*) show measured vs simulated results of the TSV_A without additional via.

FIGS. 2.11(*a*) and (*b*) show measured vs simulated results of the TSV_A with additional via at 45 degrees.

FIGS. 2.12(*a*) and (*b*) show measured vs simulated results of the TSV_A with additional via at 90 degrees.

DETAILED DESCRIPTION OF THE EMBODIMENTS

TSV Antennas for Multi-Band Network-On-Chip

I. Introduction

Exascale computing and the increasing need of processing power have cultivated increasing number of on-chip processing elements (PEs), therefore increasing the total overall area required. The increase in distance has a negative effect in packet latency, congestion, and total throughput of the system. Chip multiprocessors (CMPs) feature the communication infrastructure of a Network-on-Chip (NoC) to address this communication challenge.

On-chip antennas, implementing wireless interconnects, are introduced for improved scalability of NoCs in. These antennas act as shortcut links for on-chip long-distance communication. The bandwidth of on-chip antennas in literature vary from 1 GHz to 16 GHz. On-chip antennas offer improved latency and broadcasting capabilities. The resonant frequency of antennas (the frequency in which radiation is at maximum) is based on the design and size of the antenna. Most antennae in literature operate on a single wireless channel based on the resonant frequency, which limits the overall in-flight transactions on the network. Additional wireless channels in the network would require an antenna with multiple resonant frequencies, and added modulation in order to facilitate flow control and prevent interference.

With the growing shift in parallel computation, and the adoption of Message Passing Interface (MPI) as the primary programming standard of parallel HPC workloads, there is an increasing need of distributed, near-instant, synchronization across PEs. Multiple wireless bands (channels) can be achieved in various ways; each at a unique cost of area, power, and complexity. The established methods to have more than one wireless band include: 1) Directional antennas, 2) splitting the transmission bandwidth of the antenna, and 3) include different types of antennas at different resonant frequencies.

Directional antennas, which may work in pairs, allow for multiple wireless channels but their functionality is based on line-of-sight and is subject to cross-interference. Creating multiple wireless channels by splitting the bandwidth of the antenna requires more complex modulation logic and additionally the specified antenna must achieve a high enough bandwidth. Antennas with different resonant frequencies can be implemented, although the fabrication process will increase in complexity due to the all the possible antenna designs (dipole, zig-zag, meander, folded, log-periodic). Path loss, or insertion loss due to antenna distance, is also a design consideration. Due to the limiting surface propagation of the wave and the lack of any waveguides, path loss increases exponentially with distance until the antenna cannot be operational at that resonant frequency. Adding multiple antennas to account for path loss is prohibitive due to a significant design overhead.

An on-chip antenna (TSV_A) may be implemented with TSVs based on the disc-loaded monopole antenna-style as described herein. The proposed antenna design can operate long distance (up to 30 mm is simulated with only 3 dB loss) and can be optimized to support multiple frequency bands without needing line-of-sight. An illustrative cross-section of two TSV_A pairs 102, 104 is shown in FIG. 1.1. The cross-section includes both the front and back end of line (FEOL and BEOL) of standard CMOS fabrication to visualize the location of the main propagation wave (in the Si layer) and the TSV_A. Finite-element method may be used through High Frequency Structure Simulator (HFSS) to validate operation of the TSV_A. A custom mapping algorithm, which considers the multi-band properties of the TSV_A, may be introduced to improve the placement location on the NoC. Wireless Network-on Chip (WNoC) evaluations utilizing a cycle-accurate SystemC network simulator are performed to measure performance improvement compared to wireless and non-wireless topologies.

II. Proposed TSV Antenna (TSV_A)

The design of the proposed antenna is based on a typical disc-loaded monopole antenna. A TSV acts as the main radiating part of the monopole antenna: An on-chip antenna design labeled TSV_A is illustrated in the cross-section of FIG. 1.1. The detailed model of the TSV_A is shown in FIGS. 1.3(*a*) and (*b*). A cylindrical disc 1302 placed on the bottom of the TSV is used for impedance matching to improve the overall signal strength. Top and bottom ground planes 1330 are added to the silicon substrate 1350 in the FEOL of IC fabrication to act as a wireless waveguide for the signal. A small gap of silicon 1310 is placed between the cylindrical disc and the bottom ground 1330 to modify their capacitance. The TSV_A proposed herein can operate in multiple bands of frequency, based on the different design parameters of the TSV acting as the main radiating part of the antenna. Height, TSV radius, disc radius, and Si gap radius are the main design parameters of the TSV_A.

A feasibility of the aspect ratio of 5-1 selected in this work for the largest TSV_A size has been demonstrated. The TSV_A is placed inside the layer of silicon (Si) substrate. The size of the silicon box is 3 mm×3 mm×height (where height is one of the tunable parameters of the TSV_A). The relative dielectric constant ($\varepsilon_r$) used for the Si substrate is 11.7. The TSV material is selected to be copper (Cu). A coplanar waveguide (CPW) is used to feed the signal to the TSV_A. There is active research in the manufacturing of TSVs for 3D ICs and interposers. The TSV_As benefit from this packaging and manufacturing innovations. The configuration of the bands can be advanced as the aspect ratio of TSVs improve.

III. Experimental Evaluation of TSV_A

HFSS simulation results for the TSV_A are provided in Section A to verify:
  Communication quality through scattering parameters,
  Bandwidth analysis to demonstrate feasibility of multi-band operation, and,
  Possible configurations through design space exploration.
  Path loss analysis (transmission coefficient S21) of the TSV_A is performed in Section B.

A. TSV_A Scattering Parameters

S-parameters describe the input-output relationship between antennas, characterizing the channel to identify the frequency and bandwidth of transmission. Reflection coefficient (S11) represents how much power is reflected from the TSV_A (lower is better). The TSV_A reflection coefficients for (arbitrarily selected) 5 different radius values are shown in FIG. 1.4. With the change in radius, the resonant frequency shifts, with non-overlapping bands with sufficient bandwidth of communication. Multiple TSV_As with different parameters can be implemented on-chip at design-time to enable multiband transmission.

Five representative bands are shown in FIG. 1.4 and there is room for more bands, as marked on the figure. The bottom ground plane can be removed to extend the bandwidth of the TSV_A up to 10 GHz. Due to the placement of the TSV_A in a wireless waveguide, the bandwidth for different configurations is narrow (~1 GHz) compared to the theoretical CNTs discussed above. This comes at the drawback of not having as many bands. For instance, between 40 GHz and 80 GHz, a 1 GHz bandwidth would enable 26 bands with a separation of 0.5 GHz between bands. For 10 GHz bandwidth, on the other hand, the number of bands falls to 3.

Design space exploration (DSE) is performed to provide general design guidelines for TSV_As. For generality, the geometry of the TSV is selected as a cylinder. For a specific technology or etching process, the geometry of the TSVs can be adjusted, for instance, into a circular cone with angled walls. The parameters in DSE are depicted in FIG. 1.3 (b). The TSV_A height is simulated from 500 µm to 300 µm, and the TSV_A radius is simulated from 120 µm to 5 µm. The TSV_A height shifts the carrier frequency between the 50 GHz and 75 GHz bands, and the TSV_A radius adds an additional 5 GHz range. Shorter TSV_As with a smaller radius operate at higher frequencies. The disc and the Si gap radius improve the reflection coefficient of the TSV_A. Smaller Si gap and larger disc radius improve the return loss up to 10 dB. The disc radius and Si gap are simulated from 120 µm to 5 µm and 15 µm to 1 µm, respectively. Each design parameter changes particular characteristics of the wireless channel at varied magnitudes, making the TSV_A a highly configurable wireless interconnect.

B. Path Loss Analysis

Transmission coefficient (S21) represents the power received at the second TSV_A relative to the power input to the first TSV_A (higher is better). Path loss is a major component in the characterization of transmission distance and power consumption and represents the reduction of the input power as the EM field propagates through the substrate. Path loss analysis is performed for the TSV_A and compared against the planar log-periodic and meander antenna. The results of the evaluation are shown in FIG. 1.5. The two TSV_As (Tx and Rx) are placed at increasingly further distance (1.25 mm-30 mm) from each-other and the transmission coefficient (S21) is recorded from the HFSS FEM simulations. The TSV_A has an almost constant and very low −3 dB path loss due to the top and bottom ground planes acting as a wireless waveguide for the signal. The planar log-periodic and meander antennas suffer from exponential increase in path loss (up to −40 dB for the meander and up to −35 dB for the log-periodic antennas) due to the surface-propagation of the EM field.

The improvement in path loss of the TSV_A compared to the planar log-periodic antenna sacrifices bandwidth. TSV_As with increased bandwidth can be implemented by removing the bottom ground plane. The TSV_A without the bottom ground plane has a larger path loss of ~−10 dB. Nonetheless, the TSV_A without the bottom ground plane has an improvement in path loss of 3× compared to the logperiodic antenna. Improved path loss leads to several benefits, including: 1) The removal of low-noise amplifiers (LNAs), 2) low and constant power consumption, and, 3) increased TSV_A position flexibility during design-time.

IV. Network-on-Chip Performance Analysis of TSV_A

Cycle-accurate network simulations are performed to measure performance improvement, area, and power consumption of the proposed multi-band WNoC with TSV_As. Details about the WNoC simulator, traffic patterns, and routing algorithm are presented in Section A. To maximize the network coverage of the TSV_As, an antenna placement algorithm is proposed in Section B. The algorithm is contrasted with a Monte Carlo uniform distribution analysis to quantify the TSV_A placement WNoC performance. WNoC performance evaluations of throughput, energy per flit, latency, and energy delay product for multiple configurations are shown in Section C. The analyses of NoC area and technology scaling are detailed in Section D.

A. Experimental Setup

A cycle-accurate SystemC network simulator is used to perform the WNoC with multi-band performance evaluation. Multiple design choices, including mesh size and buffering, are shown in FIG. 1.11, Table I. The mesh size arbitrarily chosen for this experimental evaluation is 12×12 (total 144 PEs), and the total number of wireless antennas is 64 TSV_As. Multiple band configurations are evaluated, ranging from 1 single band of 64 TSV_As on the WNoC to 8 separate bands of 8 TSV_As. The packet size is 10 flits and the flit size is 32 bits. Area and power estimations are performed utilizing the latest version of DSENT. The energy per bit and area values of the wireless transceiver are obtained from Yu et al. [17].

1) WNoC Traffic Patterns Overview: Five traffic patterns are used to analyze the WNoC: 1) uniform random, 2) bit transpose, 3) bit reversal, 4) shuffle, and 5) butterfly. The main focus of this WNoC analysis is to provide a thorough investigation of network performance utilizing TSV_As, focusing solely on the packet-transfer aspect, so the synthetic traffic is appropriate (and preferred). Real application workloads such as Splash2 and Parsec3 benchmarks have low utilization rate of the NoC and do not allow for thorough network analysis.

WNoC Routing Algorithm: The routing algorithm used in the WNoC is a simplistic shortest path route, through a wired or a wireless link. In particular, the distance between the source and the destination through a wireless link is compared to the distance of a conventional wired link between the source/destination pair before committing to either link. Packet routing through the wired links is carried out with a deterministic XY-dimension order routing algorithm. A tokenpassing arbitration mechanism is used between the wireless nodes operating in the same frequency band. The token dictates which TSV_A can transmit at that particular cycle. This selective approach in the usage of the wireless links avoids creating bottlenecks in the network. After the placement of the TSV_As each node can be either TSV_A-equipped or not, therefore the router is checked if it can wireless transmit the packet and if the receiving TSV_A is closer than the wired distance utilizing XY routing. The algorithm only checks for TSV_As that are in the same frequency band as the current TSV_A-equipped router. If the token is not currently assigned to the current TSV_A, the packet is placed in a buffer for transmission.

B. WNoC Multi-Band Placement

As discussed above, the TSV_A has multi-band properties tied to the parameter configuration of the TSV acting as the main radiating element. Other antenna designs show multi-band properties as well, but their concurrency dictates more complex modulation logic for each band. Increased modulation logic for each band on one antenna leads to larger area and power consumption. The TSV_A varies wireless bands based on simple physical properties (such as TSV radius), decreasing the overall complexity of modulation for each antenna, in addition to three orders of reduction in antenna size ($\mu m$ size TSV_As vs mm-long antennae in literature). Furthermore, more complex modulation (as opposed to the basic on-off keying) can be applied to the TSV_As for an additional increase in the number of bands. Antenna placement is critical in ensuring the highest wireless throughput for the WNoC with TSV_As. Existing multi-band antennas in literature (which have multiple resonant frequencies) do not consider wireless coverage (if the signal from each antenna can reach the entire area of the chip) because their modulation logic handles all traffic from all bands. To this end, a TSV_A placement algorithm 1, shown in FIG. 1.12, for multiband WNoCs improves network throughput and latency.

1) Multi-Band Placement Algorithm: The main objective of Algorithm 1 is to minimize the aggregate hop count of the NoC by introducing shortcut links in the network through the TSV_As. The solution space for antenna placement grows exponentially with mesh size, therefore Algorithm 1 is based on simulated annealing (SA). The input to the algorithm takes into account the mesh dimensions, the number of wireless bands, and the number of TSV_As for each band. The first step of the algorithm is to calculate the aggregate hop count without TSV_As, which is calculated as the sum of all hops for all source and destination pairs utilizing XY routing. After the totalDist is calculated, a random placement of all TSV_As in a band is performed. Simulated annealing (line 2) randomly swaps TSV_As with their nearest neighbors for i amount of iterations. The totalDist is re-calculated (line 5), if it is smaller than the current totalDist the current placement of the TSV_A is stored in permPlacement[ ] (lines 3-7). If the random swap affected totalDist negatively, there is a possibility (lines 8-12) that the TSV_A will still be stored in perm-Placement[ ] (line 11). The updated totalDist is then used as the new reference for other swaps. Additional TSV_A swaps are performed for the total number of iterations i, afterwards t is decremented by 5% and the procedure is repeated until tfinal (line 2). This process is completed for all wireless bands (line 1) and the totalDist is updated throughout with the new added wireless shortcut links. The final result of the algorithm is a placement of all TSV_As from all available wireless bands to globally minimize the aggregate hop count of the WNoC.

2) Multi-Band Monte Carlo Analysis: Monte Carlo uniform distribution analysis is performed to evaluate the efficacy of Algorithm 1. A thousand (1,000) different random TSV_A mappings for each packet injection rate are compared to the WNoC with TSV_As placed using Algorithm 1. The number of bands is kept constant at 4 frequency bands, and each band is equipped with 16 TSV_As. Performance is measured as average latency on a 12×12 WNoC, utilizing uniform random traffic, all other parameters are described in Table I. As shown in FIG. 1.6, the average latency of the WNoC utilizing Algorithm 1 is ~11% worse on average than the minimum, ~20% better on average than the maximum, and ~9% better on average than the mean of the thousands of random TSV_A mapping solutions C. WNoC Performance Evaluation Simulations results of the multiple WNoC configurations under different synthetic traffic patterns are shown in FIGS. 1.7(a)-(d). The performance metrics evaluated are:

1) Throughput,
2) Average energy per flit,
3) Normalized average latency, and,
4) Energy-delay per flit The results shown are focused on the performance at network saturation for each WNoC configuration, a norm in NoC literature. In order to identify the network saturation point for each network traffic pattern and configuration, the packet injection rate is analyzed from 0.05 up to 0.9 flits/cycle/IP. For instance, network saturation of WNoC with 4 wireless bands for uniform random traffic pattern occurs at ≈0.5 flits/cycle/IP.

Additional details regarding the WNoC configuration, including VC count and packet size, are shown in FIG. 1.11, Table I.

Throughput: Throughput results are shown in FIG. 1.7(a). Across all traffic patterns and multiple wireless bands, network throughput improves considerably. The improvement is up to ~52% in the uniform random traffic pattern compared to the flat mesh topology. Each traffic pattern favors a different WNoC configuration, the uniform random traffic pattern clearly favors as many wireless bands as possible, which in turn increase the total number of flits-in-flight. Because the uniform random traffic pattern does not have a specific source-destination mathematical model (as opposed to the other patterns), throughput improvement of ~52% from the flat mesh and ~29% from the single band WNoC is directly correlated to the increase in wireless channels/bands. Similar behavior is observed with the bit-reversal and shuffle traffic pattern, up to ~33% compared to the single band WNoC. The WNoC running the transpose traffic pattern has the highest throughput of ~35% with 4 bands as opposed to other configurations. Increased the number of bands, while increasing the flits in flight, also decreases overall coverage. Therefore, some locations might be reachable only through band-hopping and wired traversals, which in turn lowers the total throughput of the network. The butterfly traffic pattern does not utilize the benefits of added bands, as throughput improvement is constant at 6% with an increasing number of wireless channels.

Latency: Network latency evaluation is shown in FIG. 1.7(b). Similar to throughput, latency is improved across the board, up to ~38% when compared against the flat mesh topology. The bitreversal and shuffle traffic patterns display an increase in latency with an increasing number of wireless bands. This is attributed to the additional hops necessary to switch bands in case the destination node is in a different band. In the case of the uniform random traffic pattern, latency is improved up to ~10% with the addition of multi-band support. The largest improvement in latency comes from the butterfly traffic patterns, with an improvement of up to ~14% in latency. WNoC running the transpose traffic pattern has an improvement in latency up to ~7% with added multi-band support.

Energy per flit: Energy per flit evaluation of multiple WNoC configurations is shown in FIG. 1.7(c). Energy estimations are performed utilizing the latest version of DSENT using the 32 nm technology node. The energy for a wire less transfer is 1.2 pJ/bit based on the transceiver proposed in using the 65 nm technology node. No power scaling for the OOK transceiver has been performed. According to FIG. 1.7(c), there is a decrease of ~28% in energy per flit compared to the flat mesh topology. This is excepted when considering the increase in network throughput of 52% and decrease in network latency of ~38%. In the case of the uniform random traffic pattern, the increase in energy per flit from 1 band to 8 bands is ~10%. The transpose and butterfly traffic patterns have an improvement in energy consumption with 4 wireless bands, up to ~20% and ~5%, respectively. The bitreversal and shuffle traffic patterns show decreased energy per flit up to ≈30% on 8 bands compared to the single band.

Energy-delay product: Energy-delay product evaluation is shown in FIG. 1.7(d). This performance metric is especially useful because network latency and energy per flit are both taken into account, therefore characterizing the improvement in network performance considering the added energy consumption. All traffic patterns display an improvement in EDP when contrasted against the flat mesh. An average improvement of ~35% and a maximum of ~50% in EDP are obtained through the WNoC multi-band configurations. The uniform random traffic pattern has an EDP improvement of ~50% in the single band configuration, Multiple bands also feature significant EDP improvement of ~40% compared to the wired flat mesh. The transpose and bitreversal traffic patterns have an improvement in EDP with the increase of wireless bands. The shuffle traffic pattern improves EDP up to ~7% when in 2-band and 8-band configuration, although EDP increases ~10% in the 4-band configuration (compared to the single band configuration), which is still 6% better than flat-mesh. The butterfly traffic pattern has an improvement in EDP up to ~20% with the addition and increase of wireless bands.

D. Area and Technology Scaling

Area and technology scaling analysis are performed to evaluate the impact of future scaling trends on the WNoC with TSV_As. The area overheads for the router, antennas, and transceiver are shown for multiple technology nodes in FIG. 8. These numbers account for individual routers, antennas, and transceivers. The antennas measured are the planar log-periodic [8], meander [24] and TSV_A. In the case of multiple wireless bands, the area of the largest TSV_A is selected. The radius of the TSV_A is increased by 10 µm for each additional band. The area of the single band TSV_A is 400 µm$^2$, the area of the largest TSV_A in the 4-band configuration is 6.40×10$^3$ µm$^2$.

In contrast, the area for the log-periodic antenna is 1.32× 10$^6$ µm$^2$, and the area of the meander antenna is 1.06×10$^5$ µm$^2$. The proposed single-band TSV_A offers 3300× and 265× area reduction compared to the planar logperiodic and meander antennas, respectively.

The original design for the transceiver proposed in other work was in the 65 nm technology node. Area scaling from 65 nm to smaller technology nodes is performed following standard CMOS scaling equations. In the case of the TSV_As, the largest impact in network area is attributed to the router logic/buffering and the OOK transceiver for the wireless interconnects. On the other hand, the meander and planar logperiodic antennas are exponentially larger than the TSV_A solution. The area overheads for both router and transceiver decrease with technology scaling. The TSV_A area depends on the number of bands and the carrier frequency.

The average energy per flit for WNoC on a uniform random traffic pattern at multiple technology nodes is shown in FIG. 1.9. The values in parenthesis indicate the energy consumed by the TSV_A of 1.2 pJ/bit. It is observed from FIG. 1.9 that the energy per flit consumption decreases ~30% from 32 nm to 22 nm. The decrease of energy per flit when the technology node scales from 32 nm to 11 nm is even larger, at ~75% energy per flit improvement. Although there is an increase in energy per flit with the addition of multi-band, the 8-band configuration (largest evaluated) has ~6% lower energy per flit compared to the flat mesh NoC.

The normalized energy-delay product per flit for WNoC on a uniform random traffic pattern at multiple technology nodes is shown in FIG. 1.10. Significant EDP improvement of ~50% can be achieved with the addition of TSV_As in the flat mesh. Additional bands show an improvement of ~40% over the flat mesh topology. Technology node scaling does not impact the benefits in EDP of up to ~50%, the EDP improvement is sustained in both the 22 nm and 11 nm technology nodes.

Measurement and Evaluation of TSV Antennas

I. Introduction

To mitigate the ever-increasing size of microprocessors, and improve the network performance, Network-on-Chip (NoC) communications subsystem may be used in place of the typical interconnect bus or crossbar. Although NoCs have shown to be the most viable alternative to an interconnect bus, scalability of the system still remains an open problem. The inclusion of on-chip antennae creates shortcut links capable of traversing the entire NoC without congesting the wire-based interconnect. Wireless NoCs allows for improved latency of long-distance data transmission but one of the main issues is the signal attenuation (path loss) of the on-chip antenna.

The most prominent on-chip antenna designs are the dipole and zig-zag that have a surface-propagation of EM waves. Although on-chip transmission is possible, the main detriment of these antennae and surface propagation in general is the poor signal attenuation (path loss) even at small distances of 5 mm. With the increase of die size and even the introduction of non-monolithic multidie chips there is a pressing need for improved radiation efficiency and transmission gain at further distances. The proposed TSV_A propagates the signal through the silicon substrate of the die, creating a guidance medium that is capable of transmitting at further distances than the normal surface-propagating antennae. An illustrative (not to scale) representation of two TSV_A communicating is shown in FIG. 2.1. The silicon substrate layer with top and bottom ground planes act as a wireless waveguide for the signal generated from the TSV_A and it propagates throughout the entire layer with minimal attenuation. Fabrication of the TSV_A follows the standard 3D-IC procedures for typical TSVs, although the silicon substrate would optimally be dedicated exclusively for wireless communication.

A printed circuit board prototype with multiple variations and distances of a pair of TSV_A may be fabricated to validate the finite element method solver evaluations performed with the High Frequency Structure Simulator (HFSS). PCB fabrication may include three different TSV_A structures at two distances, and a co-planar waveguide (CPW) to evaluate minimal signal loss across respective distances. Fabrication measurements through a Vector Network Analyzer (VNA) support the simulation results performed with HFSS. The CPW insertion loss at a length of 1.7 inch is ~3 dB. When a portion of the CPW is replaced by a pair of TSV_As at a distance of 800 mil the overall insertion loss is measured at ~6 dB, a TSV_A insertion loss of 3 dB.

II. PCB Prototype of TSV_A Design

There have been two dimensions for the PCB prototype, 1300×500×34 mil and 1700×500×34 mil, which are non-limiting, in order to evaluate the performance of the TSV_A at different distances. A cross-section of the PCB layers used is shown in FIG. 2.2. The prototype uses a Rogers RO4003C material with a dielectric constant $\varepsilon_r$ of 3.55, therefore the TSV_As have been resized to match the change in $\varepsilon_r$ from silicon to RO4003C. In addition to top and bottom ground planes (~1 mil each), an intermediate ground plane is part of the structure in order to optimize the CPW and minimize the number of modes excited. Additional via across the CPW are added to improve signal transfer to the TSV_A.

The PCB prototype includes three different TSV_A structures measured at two distances, 400 mil (~10 mm) and 800 mil (~20 mm). The TSV_A may be fed through a CPW with a length of 450 mil on each port. The overall length of the board is either 1300 mil or 1700 mil, depending on the distance between the TSV_A. Also included for thoroughness, is a CPW feed line that goes over the entire distance of the boards, in order to differentiate the insertion loss incurred from a typical CPW as opposed to the proposed TSV_A. The CPW structure is detailed in Section A. The three TSV_A structures are detailed in Section B.

A. Co-Planar Waveguide Design

A CPW is build in order to provide the signal to the TSV_As. End launch connectors (50 GHz) from Southwest Microwave may be used to connect the PCB prototype to the VNA (PNA-X N5247A). A CPW length of 450 mil has been selected for each port to adequately distance the end launch connectors from the TSV_As. Additionally, a separate structure with the CPW spanning the entire distance of the board was also measured to evaluate the typical insertion loss incurred.

The full-distance CPW is shown in FIG. 2.3, which includes a magnified look at the connection to the end launch connectors. The trace width of the CPW is 17 mil, substrate thickness is 8 mil (intermediate ground plane of the PCB acts as the bottom of the CPW) and the spacing between the top ground plane and the trace width is 10 mil on both sides. In respect to HFSS evaluation, a coaxial structure was used in tandem with a HFSS wave port optimized for a 50Ω input impedance.

B. TSV Antenna Design

The structure for the TSV_A is presented in FIG. 2.4. The dimensions of the TSV_A may persist across variations, the height of TSV_A may be 34 mil and the perimeter is 8 mil. There is a cylindrical disc placed at the bottom of the TSV_A used for impedance matching to improve the overall strength of the signal. The disc radius is 16 mil but the outer radius (exposed) is 12 mil. A small gap (8 mil) is placed between the disc and the bottom ground plane to modify the structure's capacitance. The TSV_A therefore is based on the disc-loaded monopole antenna. The dimensions chosen have taken into consideration the PCB manufacturing capabilities and limitations.

The PCB prototype may include three different TSV_A structures, shown in FIG. 2.5, has two TSV_As connected through the CPW feed line. The distance between TSV_As is 400 mil or 800 mil, depending on the PCB prototype size and it is constant across the 3 different structures, with all dimensions being suggested.

The second PCB structure, shown in FIG. 2.6, has additional via placed at a 45° angle with respect to the TSV_A. These via provide additional directivity for the radiation emitted by the TSV_A.

The third and last PCB structure with TSV_As, shown in FIG. 2.7, has additional via placed at a 90° angle with respect to the TSV_A. This structure was included in order to provide a divide between the CPW feed and the actual TSV_A in case of possible interference by the VNA or additional excited modes. The overall fabricated PCB prototype is shown in FIG. 2.8. Both dimensions (1300 mil and 1700 mil) and all four structures (including the CPW feed line) are fabricated in the same board. Additional via have been added to the sides of each structure to keep the structures separate from each other.

III. Simulated and Measured Results

The principal outcomes of the PCB prototype and HFSS simulation evaluation are:
Verify, through PCB fabrication, that the TSV_A structure is capable of wireless transmission with minimal insertion loss.
Verify, through simulated vs measured results comparison, that the fidelity of HFSS finite element method simulation permits further design decision without PCB fabrication.

The PCB prototype simulated and measured results include:
1) The CPW structure at two different sizes, 2) the TSV_A structure without additional via, 3) the TSV_A structure with additional via at a 45° angle, 4) the TSV_A structure with additional via at a 90° angle.

A. CPW Results

A comparison of the simulated and measured results of the CPW for both dimensions is shown in FIG. 2.9. The CPW structure is shown in FIG. 2.3. The standalone CPW structure was included in the PCB prototype particularly to verify the insertion loss, which needs to be factored in the overall structure to accurately estimate the insertion loss from the TSV_As alone.

Although the measured results are similar to the simulated ones, there is a larger insertion loss at higher frequencies (above 35 GHz) for both dimensions. In lower frequencies (below 35 GHz) the change in insertion loss is minimal (~1 dB). Return loss (S11) is also impacted at higher frequencies, deviating by ~10 dB from the simulated results. Overall, the insertion loss is between 2 dB and 5 dB, depending on the operating frequency, for both dimensions.

B. TSV_A Results

Measured and simulated results of the first TSV_A structure for both dimensions are shown in FIGS. 2.10(a) and (b). These structures do not have any additional via except for the main TSV_A, as shown in FIG. 2.5. The major measured resonant frequency as shown in FIG. 2.10(a) is ~33 GHz. The return loss for this frequency is ~15 dB and the insertion loss is ~6 dB. A reminder that the insertion loss includes the loss from the CPW feed, therefore actual loss from the TSV_A alone is even lower. A minor resonating frequency in 22 GHz has a matching insertion loss of ~7.5 dB. The simulated results have a minor shift in frequency for both return and insertion loss, visible around 40 GHz (S11) and 25 GHz (S21).

The major measured resonant frequencies as shown in FIG. 2.10(*b*) are in ~21 GHz and in ~33 GHz. These resonant frequencies match the previous structure, although insertion loss drops to ~16 dB for the 33 GHz resonant frequency. The minimum insertion loss is ~6 dB around ~21 GHz, which matches the first resonant frequency. Simulated evaluations manage to closely match the S21 peaks in the 20 GHz to 25 GHz, although there is a still a small shift in frequency. Magnitude-wise, the HFSS simulator appears to be accurate on and around the resonant frequencies (for both 400 mil and 800 mil structures) and ~10 dB more optimistic in other regions.

C. TSV_A with 45° Angle Via Results

Measured and simulated results of the second TSV_A structure for both dimensions are shown in FIGS. 11(*a*) and (*b*). These structures have additional via lined up at a 45° angle with respect to the main TSV_A, as shown in FIG. 2.6. There are multiple major measured resonant frequencies as shown in FIG. 2.11(*a*). The return loss for these frequencies is between 9 dB and 15 dB and the insertion loss is ~6 dB at 23 GHz and 35 GHz. The simulated results match the measured results quite closely and all resonant frequencies are accounted for in the HFSS results. Magnitude-wise, HFSS seems to be overly optimistic in the higher frequency ranges (above 35 GHz) but closely matches magnitude in the lower frequency ranges (below 35 GHz).

There are multiple major measured resonant frequencies as shown in FIG. 2.11(*b*). Insertion loss appears to be consistently less than 10 dB for each of the major resonant frequencies. The 45° angled via provide additional directivity to the main TSV_A, thus improving insertion loss at further distances. The additional directivity can be adapted to isolate the signal and provide multi-band operation in a System-on-Chip or Network-on-Chip. Simulations results appear to be pessimistic when calculating S11 and closely matched when computing S21. Simulated results of higher frequencies are not as accurate and tend to be optimistic in computing insertion loss.

TSV_A with 90° Angle Via Results

Measured and simulated results of the third TSV_A structure for both dimensions are shown in FIGS. 2.12(*a*) and (*b*). These structures have additional via lined up at a 90° angle with respect to the main TSV_A, as shown in FIG. 2.7. The major measured resonant frequencies appear to be constant throughout the various TSV_A structures. Insertion loss appears to be consistently less than 12 dB for each of the major resonant frequencies below 40 GHz. Simulations results present a similar pattern to the previous structure, HFSS appears to be pessimistic in S11 calculations, and optimistic or closely matching measurements in S21 calculations. At higher frequencies (48 GHz), HFSS has computed a resonant frequency that the measurements did not find. The TSV_A dimensions are optimized at an operating frequency range of 25 GHz to 35 GHz, although other resonant frequencies may be viable due to the top and bottom ground plane acting as a reflective material for the EM waves.

The major measured resonant frequencies as shown in FIG. 2.10(*b*) are in ~21 GHz, ~28 GHz, and in ~37 GHz. The minimum insertion loss is ~4 dB around 21 GHz and the maximum insertion loss (out of the resonant frequencies) is ~12 dB around 37 GHz. Simulated results of S11 do not correspond in magnitude to the measured resonant frequencies. HFSS appears to be overly pessimistic in calculating the resonant frequencies for this structure, this can be attributed to the resolution of the simulation and the large amount of via present. It is recommended to increase the mesh resolution of the design and perform a discrete measurement of each frequency as opposed to the fast or interpolation methods. At lower frequencies (below 40 GHz), simulation results of insertion loss appears to be match the measured results. The TSV_A dimensions are optimized for these frequency ranges, therefore a small insertion loss is expected at these resonant frequencies.

IV. Conclusions

This work proposes a through-silicon via antenna (TSV_A) based on the disc-loaded monopole antenna. In order to verify functionality and performance, a PCB prototype was fabricated and measured with a VNA. Measurements results indicate that the TSV_A is capable of transmission up to 800 mil (20 mm) distance at a minimal insertion loss. Multiple TSV_A structures with additional via to improve directivity are measured and evaluated, improving insertion loss from the standalone TSV_A up to 4 dB. Finite element method simulations, executed through HFSS, appear to match the measured results in lower frequencies. Higher frequencies may require further mesh refinement and increased simulation resolution to match measurements. HFSS is pessimistic in calculating return loss, although simulated insertion loss closely matches measurements at resonant frequencies.

While the invention has been described with reference to the embodiments described herein, a person of ordinary skill in the art would understand that various changes or modifications may be made thereto without departing from the scope of the claims.

The invention claimed is:

1. An on-chip antenna (TSV_A) comprises:
   through substrate via antennas that act as a main radiating part of a monopole antenna;
   a cylindrical disc placed on the bottom of the TSV_A used for impedance matching to improve signal strength; and
   top and bottom ground planes attached to the silicon substrate that act as a wireless waveguide for the signal;
   wherein a gap of silicon is placed between the cylindrical disc and a bottom ground.

2. The on-chip antenna of claim 1, wherein the impedance matching improves the overall signal strength.

3. The on-chip antenna of claim 1, further comprising a gap of silicon placed between the disc and a bottom ground to modify capacitance.

4. The on-chip antenna of claim 1, wherein the silicon substrate further includes top and bottom ground planes.

5. The on-chip antenna of claim 1, wherein the ground planes act as a wireless waveguide for a signal through the TSV_A.

6. The on-chip antenna of claim 1, wherein the TSV_A comprises copper.

7. The on-chip antenna of claim 1, wherein the TSV_A includes a via.

8. The on-chip antenna of claim 7, wherein the via is angled at 45 degrees.

9. The on-chip antenna of claim 7, wherein the via is angled at 90 degrees.

10. The on-chip antenna of claim 1, wherein an area of the antenna on the substrate is 400 square micrometers.

11. The on-chip antenna of claim 1, wherein wireless communication occurs through the silicon substrate that acts as a wireless waveguide for a signal.

12. The on-chip antenna of claim 1, wherein the TSV_A does not radiate on the surface of the silicon substrate.

* * * * *